(12) United States Patent
Nakajima et al.

(10) Patent No.: US 11,392,037 B2
(45) Date of Patent: *Jul. 19, 2022

(54) RESIST UNDERLAYER FILM FORMING COMPOSITION CONTAINING SILICONE HAVING CYCLIC AMINO GROUP

(75) Inventors: Makoto Nakajima, Toyama (JP); Wataru Shibayama, Toyama (JP); Yuta Kanno, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/867,587

(22) PCT Filed: Feb. 16, 2009

(86) PCT No.: PCT/JP2009/052535
§ 371 (c)(1),
(2), (4) Date: Aug. 13, 2010

(87) PCT Pub. No.: WO2009/104552
PCT Pub. Date: Aug. 27, 2009

(65) Prior Publication Data
US 2010/0330505 A1    Dec. 30, 2010

(30) Foreign Application Priority Data
Feb. 18, 2008    (JP) .............................. JP2008-036700

(51) Int. Cl.
*G03F 7/11* (2006.01)
*G03F 7/07* (2006.01)
(Continued)

(52) U.S. Cl.
CPC ................ *G03F 7/11* (2013.01); *C08G 77/26* (2013.01); *C08L 83/08* (2013.01); *G03F 7/0752* (2013.01); *C08G 77/80* (2013.01)

(58) Field of Classification Search
CPC ........... C08G 77/26; C08G 77/80; G03F 7/11; G03F 7/0752; C08L 83/08
See application file for complete search history.

(56) References Cited

U.S. PATENT DOCUMENTS

| 3,813,364 A | 5/1974 | De Zuba et al. |
| 4,769,308 A | 9/1988 | Hiruma et al. |

(Continued)

FOREIGN PATENT DOCUMENTS

| EP | 0 260 976 A2 | 3/1988 |
| EP | 1 798 599 A1 | 6/2007 |

(Continued)

OTHER PUBLICATIONS

Machine-assisted English translation of JP 2006-182688 (2006) provided by JPO.*

(Continued)

*Primary Examiner* — Martin J Angebranndt
(74) *Attorney, Agent, or Firm* — Oliff PLC

(57) ABSTRACT

There is provided a resist underlayer film forming composition for lithography for forming a resist underlayer film capable of being used as a hardmask. A resist underlayer film forming composition for lithography comprising a hydrolyzable organosilane, a hydrolysis product thereof, or a hydrolysis-condensation product thereof as a silane, wherein a silane having a cyclic amino group is contained in an amount of less than 1% by mole, preferably 0.01 to 0.95% by mole. A film forming composition comprising a hydrolyzable organosilane having a cyclic amino group, a hydrolysis product thereof, or a hydrolysis-condensation product thereof. A resist underlayer film forming composition for lithography comprising a hydrolyzable organosilane having a cyclic amino group, a hydrolysis product thereof, or a hydrolysis-condensation product thereof. The cyclic amino group may be a secondary amino group or a tertiary amino (Continued)

group. The hydrolyzable organosilane is a compound of Formula (1):

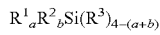

Formula (1)

$R^1_a R^2_b Si(R^3)_{4-(a+b)}$  Formula (1)

(where $R^1$ is a cyclic amino group or an organic group containing a cyclic amino group).

15 Claims, 2 Drawing Sheets

(51) Int. Cl.
  *C08G 77/26* (2006.01)
  *C08L 83/08* (2006.01)
  *G03F 7/075* (2006.01)
  *C08G 77/00* (2006.01)

(56) References Cited

U.S. PATENT DOCUMENTS

| | | | |
|---|---|---|---|
| 5,100,503 A | 3/1992 | Allman et al. | |
| 5,152,834 A | 10/1992 | Allman | |
| 5,209,775 A | 5/1993 | Bank et al. | |
| 5,302,198 A | 4/1994 | Allman | |
| 5,472,488 A | 12/1995 | Allman | |
| 5,527,872 A | 6/1996 | Allman | |
| 5,665,845 A | 9/1997 | Allman | |
| 5,962,188 A | 10/1999 | DeBoer et al. | |
| 6,576,393 B1 | 6/2003 | Sugita et al. | |
| 7,192,683 B2 | 3/2007 | Yamasaki et al. | |
| 8,808,446 B2 * | 8/2014 | Konno | G03F 7/0751 106/287.12 |
| 8,968,458 B2 * | 3/2015 | Konno | G03F 7/0752 106/287.12 |
| 2004/0253461 A1 | 12/2004 | Ogihara et al. | |
| 2004/0266925 A1 | 12/2004 | Shiono | |
| 2006/0003252 A1 | 1/2006 | Hirayama et al. | |
| 2006/0093959 A1 | 5/2006 | Huang et al. | |
| 2007/0190459 A1 | 8/2007 | Hashimoto et al. | |
| 2007/0224816 A1 | 9/2007 | Uh et al. | |
| 2008/0076059 A1 | 3/2008 | Abdallah et al. | |
| 2008/0107997 A1 | 5/2008 | Hiroi et al. | |
| 2008/0312400 A1 | 12/2008 | Yamashita et al. | |
| 2009/0050020 A1 | 2/2009 | Konno et al. | |
| 2009/0130594 A1 | 5/2009 | Takei et al. | |
| 2009/0148789 A1 | 6/2009 | Amara et al. | |
| 2009/0162782 A1 | 6/2009 | Takei et al. | |
| 2010/0151384 A1 * | 6/2010 | Konno | G03F 7/0751 430/272.1 |
| 2010/0304305 A1 | 12/2010 | Nakajima et al. | |
| 2011/0311915 A1 * | 12/2011 | Kimura | G03F 7/0392 430/271.1 |
| 2013/0023602 A1 | 1/2013 | Dorman | |

FOREIGN PATENT DOCUMENTS

| | | |
|---|---|---|
| EP | 1 855 159 A1 | 11/2007 |
| EP | 2 249 204 A1 | 11/2010 |
| JP | A-54-123965 | 9/1979 |
| JP | A-05-027444 | 2/1993 |
| JP | A-05-311158 | 11/1993 |
| JP | A-05-333292 | 12/1993 |
| JP | A-06-001796 | 1/1994 |
| JP | A-06-228459 | 8/1994 |
| JP | A-08-053560 | 2/1996 |
| JP | A-10-209134 | 8/1998 |
| JP | A-10-510860 | 10/1998 |
| JP | A-11-012544 | 1/1999 |
| JP | A-11-258813 | 9/1999 |
| JP | A-2000-282014 | 10/2000 |
| JP | A-2001-093824 | 4/2001 |
| JP | A-2001-294810 | 10/2001 |
| JP | A-2004-276603 | 10/2004 |
| JP | A-2005-070776 | 3/2005 |
| JP | A-2005-255858 | 9/2005 |
| JP | A-2006-182688 | 7/2006 |
| JP | A-2006-272588 | 10/2006 |
| JP | A-2007-031627 | 2/2007 |
| JP | A-2007-081133 | 3/2007 |
| JP | A-2007-241259 | 9/2007 |
| JP | A-2007-258622 | 10/2007 |
| JP | A-2008-038131 | 2/2008 |
| JP | A-2008-519297 | 6/2008 |
| JP | A-2008-213177 | 9/2008 |
| JP | A-2008-309929 | 12/2008 |
| JP | A-2009-244722 | 10/2009 |
| WO | WO 96/018918 | 6/1996 |
| WO | WO 98/028366 A1 | 7/1998 |
| WO | WO 00/01752 A1 | 1/2000 |
| WO | WO 2004/055598 A1 | 7/2004 |
| WO | WO 2005/088398 A1 | 9/2005 |
| WO | WO 2006/093057 A1 | 9/2006 |
| WO | WO 2007/066597 A1 | 6/2007 |
| WO | WO 2008/038863 A1 | 4/2008 |
| WO | WO 2009/034998 A1 | 3/2009 |
| WO | WO 2009/041511 A1 | 4/2009 |
| WO | WO 2009/104552 A1 | 8/2009 |
| WO | WO 2009/111121 A2 | 9/2009 |
| WO | WO 2009/111122 A2 | 9/2009 |

OTHER PUBLICATIONS

Cagnol et al ("A general one-pot process leading to highly functionalized ordered mesoporous silica films" Chemical communications, 2004, Issue 15, p. 1742-1743).*
International Search Report issued in Application No. PCT/JP2009/052535; dated Mar. 10, 2009.
European Search Report issued in Application No. 09712238.6; dated Dec. 9, 2011.
U.S. Office Action dated Oct. 4, 2013 from U.S. Appl. No. 13/058,109.
U.S. Office Action dated Oct. 21, 2013 from U.S. Appl. No. 13/681,186.
Notice of Examination Opinion and Search Report dated Feb. 6, 2014 from Taiwanese Patent Application No. 098143678 (with English-language translation).
U.S. Office Action dated May 1, 2014 from U.S. Appl. No. 13/580,066.
Nov. 2, 2009 International Search Report issued in International Application No. PCT/JP2009/064301.
Feb. 1, 2013 Office Action issued in U.S. Appl. No. 13/681,186.
Oct. 7, 2004 machine translation of JP 2004-276603.
Sep. 18, 2008 machine translation of JP 2008-213177.
Mar. 9, 2010 International Search Report issued in International Patent Application No. PCT/JP2009/070984.
May 8, 2012 Search Report issued in European Patent Application No. 09833458.4.
Feb. 7, 2013 Office Action issued in U.S. Appl. No. 13/133,751.
U.S. Appl. No. 13/133,751, filed Aug. 4, 2011.
Jun. 22, 2010 Written Opinion of ISA issued in International Patent Application No. PCT/JP2010/059117 (translation).
Jun. 22, 2010 International Search Report issued in International Patent Application No. PCT/JP2010/059117.
Oct. 19, 2010 International Search Report issued in International Patent Application No. PCT/JP2010/065307.
May 24, 2011 Translation of the Written Opinion issued in PCT/JP2011/053525.
May 24, 2011 Translation of the International Search Report issued in PCT/JP2011/053525.
Oct. 18, 2012 Restriction Requirement issued in U.S. Appl. No. 13/133,751.
U.S. Office Action dated Nov. 29, 2013 from U.S. Appl. No. 13/375,517.
U.S. Office Action dated Dec. 3, 2013 from U.S. Appl. No. 13/580,066.
U.S. Office Action dated Sep. 10, 2014 from U.S. Appl. No. 13/375,517.

(56) References Cited

OTHER PUBLICATIONS

Apr. 8, 2015 Office Action issued in U.S. Appl. No. 13/375,517.
Office Action dated Oct. 31, 2014 issued in U.S. Appl. No. 13/580,066.
Office Action cited in U.S. Appl. No. 13/496,768 dated Jan. 3, 2014.
Office Action cited in U.S. Appl. No. 13/133,751 dated Dec. 26, 2013.

* cited by examiner

[FIG. 1]
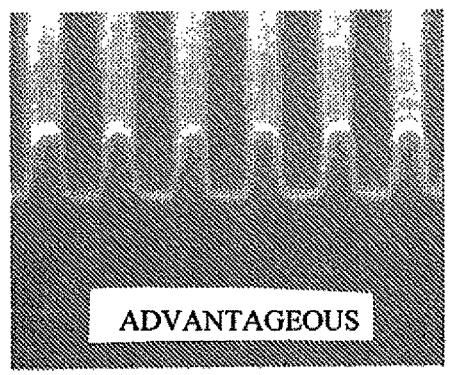
[FIG. 2]
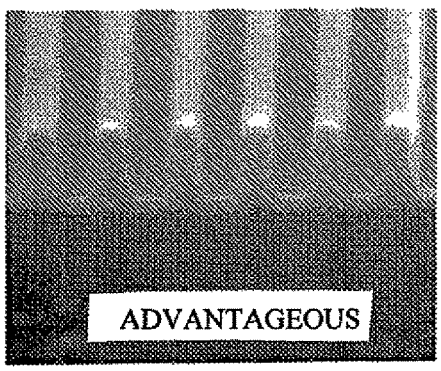
[FIG. 3]
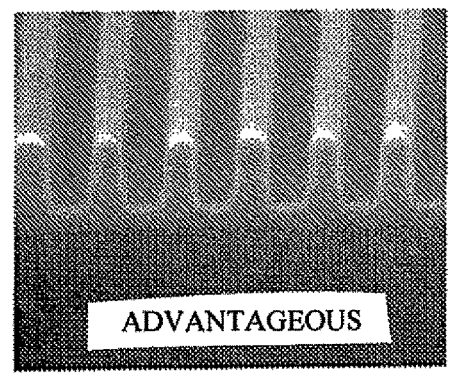
[FIG. 4]
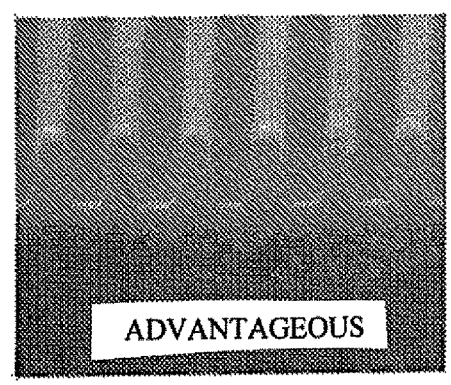

[FIG. 5]
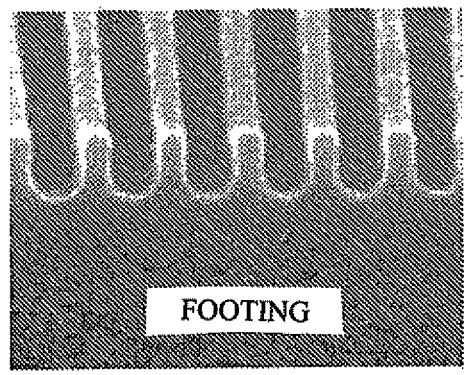
FOOTING
[FIG. 6]
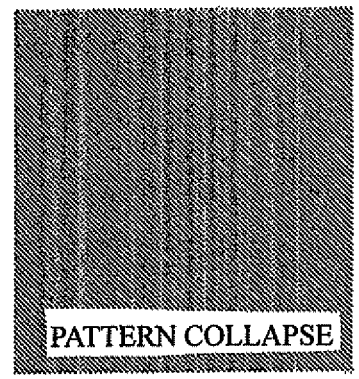
PATTERN COLLAPSE

RESIST UNDERLAYER FILM FORMING COMPOSITION CONTAINING SILICONE HAVING CYCLIC AMINO GROUP

TECHNICAL FIELD

The present invention relates to a composition for forming an underlayer film between a substrate and a resist (for example, a photoresist and an electron beam resist) that are used in the production of semiconductor devices. More specifically, the present invention relates to a resist underlayer film forming composition for lithography for forming an underlayer film used as an underlayer of a photoresist in a lithography process of the production of semiconductor devices. The present invention also relates to a forming method of a resist pattern using the underlayer film forming composition.

BACKGROUND ART

Conventionally, fine processing by lithography using a photoresist has been performed in the production of semiconductor devices. The fine processing is a processing method including forming a thin film of a photoresist on a semiconductor substrate such as a silicon wafer, irradiating the resultant thin film with an active ray such as an ultraviolet ray through a mask pattern in which a pattern of a semiconductor device is depicted for development, and etching the substrate by using the resultant photoresist pattern as a protecting film so as to form fine convexo-concave shapes corresponding to the pattern on the surface of the substrate. Recently, high integration of semiconductor devices has progressed and the active ray used in this process tends to have a shorter wavelength, e.g., an ArF excimer laser (193 nm) replacing a KrF excimer laser (248 nm). As a consequence, the influence of reflection of an active ray on a semiconductor substrate has become a large problem. In order to solve this problem, a method of providing a bottom anti-reflective coating between the photoresist and the substrate has been widely studied. For such a bottom anti-reflective coating, many investigations on an organic bottom anti-reflective coating composed of a polymer having a light absorbing group and the like are performed due to easy use and other reasons. Examples of the coating include an acrylic resin-based bottom anti-reflective coating having both a hydroxy group as a crosslinkable group and a light absorbing group within one molecule thereof, and a novolac resin-based bottom anti-reflective coating having both a hydroxy group as a crosslinkable group and a light absorbing group within one molecule thereof.

Characteristics required for the bottom anti-reflective coating include large absorbance to light or radiation, no intermixing with a photoresist (being insoluble in a photoresist solvent), no diffusion of low molecule substances from the bottom anti-reflective coating to the photoresist on the bottom anti-reflective coating during heating and baking, and a dry etching rate higher than that of the photoresist.

Furthermore, in recent years, in order to solve a problem of wiring delay, which has become apparent as the application of a finer design rule of semiconductor devices has promoted, it has been studied to use copper as a wiring material. Along with that, a dual damascene process has been studied as a wiring forming method for a semiconductor substrate. For this reason, in the dual damascene process, a bottom anti-reflective coating is formed on a substrate having a large aspect ratio in which a via hole is formed. Therefore, the bottom anti-reflective coating used in this process is required to have filling characteristics capable of filling holes without any void and planarization characteristics capable of forming a planar film on the substrate surface, for example.

As an underlayer film between the semiconductor substrate and the photoresist, the use of a film known as a hardmask containing a metal element such as silicon and titanium (see, for example, Patent Document 1) is performed. In this case, the resist and the hardmask have components largely different from each other, so that the removal rates of the resist and the hardmask by dry etching largely depend on the type of a gas used for dry etching. By appropriately selecting the type of a gas, the hardmask can be removed by dry etching without a large decrease in the film thickness of the photoresist. Thus, in the production of semiconductor devices in recent years, for achieving various effects such as anti-reflection effects, a resist underlayer film has become disposed between the semiconductor substrate and the photoresist. Although a composition for a resist underlayer film have been studied until today, the development of a novel material for the resist underlayer film is desired due to the diversity of characteristics required for the composition and the like.

There is disclosed a composition or a pattern forming method using a compound having a silicon-silicon bond (see, for example, Patent Document 2).

There is disclosed a bottom anti-reflective coating forming composition containing an isocyanate group or a blocked isocyanate group (see, for example, Patent Document 3).

There is disclosed a hardmask material using a polycarbosilane-containing resin (see, for example, Patent Document 4 and Patent Document 5).

There is disclosed a silica-based coating film forming composition containing a siloxane polymer, a solvent, and a cyclic basic compound (Patent Document 6).

There is disclosed a hardmask material using an imidazole-containing siloxane polymer (Patent Document 7).

Patent Document 1: Japanese Patent Application Publication No. JP-A-11-258813
Patent Document 2: Japanese Patent Application Publication No. JP-A-10-209134
Patent Document 3: International Publication No. WO 2000/01752 pamphlet
Patent Document 4: Japanese Patent Application Publication No. JP-A-2001-93824
Patent Document 5: Japanese Patent Application Publication No. JP-A-2005-70776
Patent Document 6: Japanese Patent Application Publication No. JP-A-2007-081133
Patent Document 7: International Publication No. WO 2006/093057 pamphlet

DISCLOSURE OF THE INVENTION

Problem to be Solved by the Invention

It is an object of the present invention to provide a resist underlayer film forming composition for lithography capable of being used in the production of a semiconductor device. More in detail, it is an object of the present invention to provide a resist underlayer film forming composition for lithography for forming a resist underlayer film capable of being used as a hardmask. It is also an object of the present invention to provide a resist underlayer film forming composition for lithography for forming a resist underlayer film capable of being used as a bottom anti-reflective coating.

Furthermore, it is an object of the present invention to provide a resist underlayer film for lithography causing no intermixing with a resist and having a dry etching rate higher than that of the resist, and a resist underlayer film forming composition for forming the underlayer film.

In addition, it is another object of the present invention to provide a resist pattern forming method using the resist underlayer film forming composition for lithography.

Means for Solving the Problem

The present invention provides: according to a first aspect, a resist underlayer film forming composition for lithography containing a hydrolyzable organosilane, a hydrolysis product thereof, or a hydrolysis-condensation product thereof as a silane, in which a silane having a cyclic amino group is contained in an amount of less than 1% by mole relative to the total silanes;

according to a second aspect, the resist underlayer film forming composition according to the first aspect, in which the silane having a cyclic amino group is contained in an amount of 0.01 to 0.95% by mole;

according to a third aspect, the resist underlayer film forming composition according to the first aspect or the second aspect, in which the cyclic amino group is a secondary amino group or a tertiary amino group;

according to a fourth aspect, the resist underlayer film forming composition according to any one of the first aspect to the third aspect, in which the hydrolyzable organosilane is an organosilane of Formula (1):

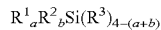   Formula (1)

(where
$R^1$ is a cyclic amino group or an organic group containing a cyclic amino group, with a N atom or a C atom at a terminal of the group being bonded to a Si atom to form a Si—N bond or a Si—C bond,
$R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, with a C atom at a terminal of the group being bonded to a Si atom to form a Si—C bond,
$R^3$ is an alkoxy group, an acyloxy group, or a halogen atom,
a is an integer of 1 or 2,
b is an integer of 0 or 1, and
a+b is an integer of 1 or 2);

according to a fifth aspect, the resist underlayer film forming composition according to any one of the first aspect to the fourth aspect, in which the cyclic amino group is an aromatic heterocyclic amino group of Formula (2):

Formula (2)

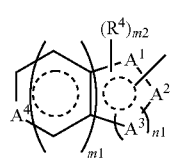

(where
$A^1$, $A^2$, $A^3$, and $A^4$ are independently a carbon atom or a nitrogen atom, at least one of $A^1$ to $A^4$ being a nitrogen atom, substituents $R^4$s are independently an alkyl group, an aryl group, an aralkyl group, an alkenyl group, a hydroxy group, or a combination thereof, $R^4$s together optionally forming a ring, n1 is an integer of 1 to 8,
m1 is an integer of 0 or 1, and
m2 is 0 or an integer ranging from 1 to a maximum number that can be substituted on a monocycle or a polycycle), or an aliphatic heterocyclic amino group of Formula (3):

Formula (3)

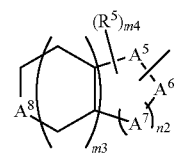

(where
$A^5$, $A^6$, $A^7$, and $A^8$ are independently a carbon atom or a nitrogen atom, at least one of $A^5$ to $A^8$ being a nitrogen atom, substituents $R^5$s are independently an alkyl group, an aryl group, an aralkyl group, an alkenyl group, a hydroxy group, or a combination thereof, $R^5$s together optionally forming a ring,
n2 is an integer of 1 to 8,
m3 is an integer of 0 or 1, and
m4 is 0 or an integer ranging from 1 to a maximum number that can be substituted on a monocycle or a polycycle);

according to a sixth aspect, the resist underlayer film forming composition according to any one of the first aspect to the fifth aspect, containing a combination of at least one type of organic silicon compound selected from a group consisting of an organic silicon compound of Formula (4):

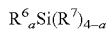   Formula (4)

(where
$R^6$ is an alkyl group, an aryl group, a halogenated alkyl group, a halogenated aryl group, an alkenyl group, or an organic group having an epoxy group, an acryloyl group, a methacryloyl group, a mercapto group, or a cyano group, with a C atom at a terminal of the group being bonded to a Si atom to form a Si—C bond,
$R^7$ is an alkoxy group, an acyloxy group, or a halogen atom, and
a is an integer of 0 to 3) and
an organic silicon compound of Formula (5):

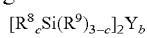   Formula (5)

(where
$R^8$ is an alkyl group,
$R^9$ is an alkoxy group, an acyloxy group, or a halogen atom,
Y is an alkylene group or an arylene group,
b is an integer of 0 or 1, and
c is an integer of 0 or 1)
with a hydrolyzable organosilane of Formula (1), a hydrolysis product thereof, or a hydrolysis-condensation product thereof;

according to a seventh aspect, a resist underlayer film forming composition containing, as the polymer, a hydrolysis-condensation product of the compound of Formula (1) described in any one of the first aspect to the sixth aspect, or of the compound of Formula (1) with the compound of Formula (4);

according to an eighth aspect, the resist underlayer film forming composition according to any one of the first aspect to the seventh aspect, further containing an acid as a hydrolysis catalyst;

according to a ninth aspect, the resist underlayer film forming composition according to any one of the first aspect to the eighth aspect, further containing water;

according to a tenth aspect, a resist underlayer film produced by applying the resist underlayer film forming composition described in any one of the first aspect to the ninth aspect on a semiconductor substrate and baking the composition;

according to an eleventh aspect, a production method of a semiconductor device including: applying the resist underlayer film forming composition described in any one of the first aspect to the ninth aspect on a semiconductor substrate and baking the composition to form a resist underlayer film; applying a composition for a resist on the underlayer film to form a resist film; exposing the resist film to light into a predetermined pattern mode; developing the resist after exposure to obtain a resist pattern; etching the resist underlayer film according to the resist pattern; and processing the semiconductor substrate according to the pattern of the patterned resist and of the patterned resist underlayer film; and according to a twelfth aspect, a production method of a semiconductor device including: forming an organic underlayer film on a semiconductor substrate; applying the resist underlayer film forming composition described in any one of the first aspect to the ninth aspect on the organic underlayer film and baking the composition to form a resist underlayer film; applying a composition for a resist on the resist underlayer film to form a resist film; exposing the resist film to light into a predetermined pattern mode; developing the resist after exposure to obtain a resist pattern; etching the resist underlayer film according to the resist pattern; etching the organic underlayer film according to the pattern of the patterned resist underlayer film; and processing the semiconductor substrate according to the pattern of the patterned organic underlayer film.

Effects of the Invention

In the present invention, the resist underlayer film is formed by an applying method on a substrate or on an organic underlayer film formed on a substrate. Then, on the resist underlayer film, a resist film (for example, a photoresist or an electron beam resist) is formed. Then, a resist pattern is formed by exposure and development. By dry etching the resist underlayer film using the resist pattern to transfer the pattern, the substrate is processed by the transferred pattern. Alternatively, by etching the organic underlayer film to transfer the pattern, the substrate is processed by the etched organic underlayer film.

In forming a fine pattern, for preventing a pattern collapse, the resist film thickness tends to become smaller. Due to the thinning of the resist, the dry etching for transferring the pattern to a film existing under the resist cannot transfer the pattern unless the etching rate of the underlayer film is higher than that of the film thereon. In the present invention, the substrate is coated with the resist underlayer film (containing an inorganic silicon-based compound) of the present invention either with or without an organic underlayer film interposed therebetween and then the resist underlayer film is coated with a resist film (an organic resist film). An organic component film and an inorganic component film have dry etching rates largely different from each other depending on the selection of the etching gas such that the dry etching rate of the organic component film is enhanced by an oxygen-based gas and the dry etching rate of the inorganic component film is enhanced by a halogen-containing gas.

For example, there is formed a resist pattern which is transferred to the resist underlayer film of the present invention existing under the resist pattern by dry etching the resist underlayer film with a halogen-containing gas, and the substrate is processed with a halogen-containing gas according to the pattern transferred to the resist underlayer film. Alternatively, by dry etching the organic underlayer film existing under the resist underlayer film, to which the pattern is transferred, with an oxygen-based gas using the resist underlayer film, the pattern is transferred to the organic underlayer film. Then, the substrate is processed with a halogen-containing gas using the organic underlayer film to which the pattern is transferred.

In the present invention, the resist underlayer film functions as a hardmask and a hydrolyzable group in the structure of Formula (1) such as an alkoxy group, an acyloxy group, and a halogen group is hydrolyzed or partially hydrolyzed, and then, forms a polymer in a polysiloxane structure by a condensation reaction of a silanol group. The polyorganosiloxane structure has a satisfactory function as a hardmask.

The hydrolyzable organosilane compound of Formula (1) having a cyclic amino group used in the present invention forms a polyorganosiloxane by a hydrolysis and a subsequent condensation reaction.

In the hydrolyzable organosilane having a cyclic amino group, when a catalyst (such as an acid catalyst) added when hydrolyzing a hydrolyzable group contained in the hydrolyzable organosilane such as an alkoxy group and an acyloxy group is used, the cyclic amino group is converted into an ammonium salt. When the amino group is a tertiary amino group, the amino group is bonded with a proton of the acid catalyst to form a tertiary ammonium salt. When the amino group is a secondary amino group, the amino group is bonded with a proton of the acid catalyst to form a secondary ammonium salt.

It is considered that a cyclic ammonium salt generated by a reaction of the cyclic amino group also acts as a catalyst for accelerating the formation of a polysiloxane by a condensation of a silanol group generated by the hydrolysis of a hydrolyzable group of a hydrolyzable silane.

The bonding moiety contained in the polyorganosiloxane has a carbon-nitrogen bond or a carbon-oxygen bond which have a dry etching rate by a halogen-based gas higher than that of a carbon-carbon bond, so that the bonding moiety is effective for transferring an upper layer resist pattern to the resist underlayer film.

Then, the polyorganosiloxane structure (intermediate film) is effective as a hardmask for etching an organic underlayer film existing under the intermediate film or for processing (etching) the substrate. In other words, the polyorganosiloxane structure has satisfactory dry etching resistance during the substrate processing or relative to an oxygen-based dry etching gas for the organic underlayer film.

The resist underlayer film of the present invention possesses an ability of enhancing the dry etching rate relative to the resist on the resist underlayer film and dry etching resistance during the substrate processing or the like.

BEST MODES FOR CARRYING OUT THE INVENTION

The present invention provides a resist underlayer film forming composition for lithography containing a hydrolyzable organosilane, a hydrolysis product thereof, or a hydrolysis-condensation product thereof as a silane, in which a silane having a cyclic amino group is contained in an amount of less than 1% by mole relative to the total silanes.

The present invention provides the resist underlayer film forming composition in which the silane having a cyclic amino group is contained in an amount of 0.01 to 0.95% by mole, more preferably 0.05 to 0.50% by mole relative to the total silanes.

The present invention provides a film forming composition containing a hydrolyzable organosilane having a cyclic amino group, a hydrolysis product thereof, or a hydrolysis-condensation product thereof.

Furthermore, the present invention provides a resist underlayer film forming composition for lithography containing a hydrolyzable organosilane having a cyclic amino group, a hydrolysis product thereof, or a hydrolysis-condensation product thereof. The hydrolyzable silane, hydrolysis product thereof, and hydrolysis-condensation product thereof may also be used in a combination thereof. The hydrolyzable silane is hydrolyzed and the obtained hydrolysis product is condensed, so that the hydrolyzable silane may also be used as a condensation product. When obtaining the hydrolysis-condensation product, a partial-hydrolysis product produced by an incomplete hydrolysis or a silane compound may be mixed to the hydrolysis-condensation product so as to be used as a mixture. This condensation product is a polymer having a polysiloxane structure. To this polysiloxane, a cyclic ammonium group converted from a cyclic amino group or an organic group containing a cyclic ammonium group is bonded. As for the cyclic amino group contained in the hydrolyzable organosilane, even when all of the cyclic amino groups are converted into a cyclic ammonium salt, cyclic amino groups partially converted into a cyclic ammonium salt may be used.

The resist underlayer film forming composition of the present invention contains a hydrolyzable organosilane having a cyclic amino group, a hydrolysis product thereof, or a hydrolysis-condensation product thereof, and a solvent. Particularly, the resist underlayer film forming composition of the present invention preferably contains a hydrolysis-condensation product of a hydrolyzable organosilane containing a cyclic amine or a cyclic ammonium salt converted from a cyclic amine, and a solvent. In addition, the resist underlayer film forming composition of the present invention may contain, as optional components, an acid, water, an alcohol, a curing catalyst, an acid generator, other organic polymers, light absorptive compounds, surfactants, and the like.

The solid content of the resist underlayer film forming composition of the present invention is, for example 0.5 to 50% by mass, 1 to 30% by mass, or 1 to 25% by mass. Here, the solid content is a component remaining after subtracting of a solvent component from the whole component of the resist underlayer film forming composition.

The ratio constituted by the hydrolyzable organosilane, a hydrolysis product thereof, and a hydrolysis-condensation product thereof in the solid content is 20% by mass or more, for example 50 to 100% by mass, 60 to 100% by mass, or 70 to 100% by mass.

The cyclic amino group is a secondary amino group or a tertiary amino group, particularly preferably a tertiary amino group.

The hydrolyzable organosilane used in the present invention has a structure of Formula (1). $R^1$ is a cyclic amino group or an organic group containing a cyclic amino group and is bonded to a silicon atom through a Si—N bond or a Si—C bond. $R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and is bonded to a silicon atom through a Si—C bond. $R^3$ is an alkoxy group, an acyloxy group, or a halogen group. a is an integer of 1 or 2; b is an integer of 0 or 1; and a+b is an integer of 1 or 2.

The alkyl group as $R^2$ in Formula (1) is a linear or branched $C_{1-10}$ alkyl group and examples of the alkyl group include a methyl group, an ethyl group, an n-propyl group, an isopropyl group, an n-butyl group, an isobutyl group, a sec-butyl group, a tert-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

As the alkyl group, a cyclic alkyl group can also be used and examples of the cyclic alkyl group include $C_{1-10}$ cyclic alkyl groups such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the aryl group include $C_{6-20}$ aryl groups such as a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the alkenyl group include $C_{2-10}$ alkenyl groups such as an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl ethenyl group, a 1,2-dimethyl-1-propenyl group, a 1,2-dimethyl-2-propenyl group, a 2-cyclopentenyl group, a 2-cyclopentenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl ethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-sec-butyl ethenyl group, a 1,3-dimethyl-1-butenyl group, a 1,3-dimethyl-2-butenyl group, a 1,3-dimethyl-3-butenyl group, a 1-isobutyl ethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl ethenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the alkenyl group also include organic groups in which the groups mentioned above are substituted with a halogen atom such as a fluorine atom, a chlorine atom, a bromine atom, and an iodine atom.

Examples of the organic group having an epoxy group include a glycidoxymethyl group, a glycidoxyethyl group, a glycidoxypropyl group, a glycidoxybutyl group, and an epoxycyclohexyl group.

Examples of the organic group having an acryloyl group include an acryloylmethyl group, an acryloylethyl group, and an acryloylpropyl group.

Examples of the organic group having a methacryloyl group include a methacryloylmethyl group, a methacryloylethyl group, and a methacryloylpropyl group.

Examples of the organic group having a mercapto group include an ethylmercapto group, a butylmercapto group, a hexylmercapto group, and an octylmercapto group.

Examples of the organic group having a cyano group include a cyanoethyl group and a cyanopropyl group.

Examples of the $C_{1-20}$ alkoxy group as $R^3$ in Formula (1) include $C_{1-20}$ alkoxy groups having a linear, branched, or cyclic alkyl portion such as a methoxy group, an ethoxy group, an n-propoxy group, an isopropoxy group, an n-butoxy group, an isobutoxy group, a sec-butoxy group, a tert-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. Examples of the cyclic alkoxy group as $R^3$ include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-isopropyl-cyclopropoxy group, a 2-isopropyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

Examples of the $C_{1-20}$ acyloxy group as $R^3$ in Formula (1) include a methylcarbonyloxy group, an ethylcarbonyloxy group, an n-propylcarbonyloxy group, an isopropylcarbonyloxy group, an n-butylcarbonyloxy group, an isobutylcarbonyloxy group, a sec-butylcarbonyloxy group, a tert-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

Examples of the halogen group as $R^3$ in Formula (1) include a fluorine atom, a chlorine atom, a bromine atom, and an iodine atom.

As the hydrolyzable organosilane of Formula (1), commercial products may be used.

$R^1$ in Formula (1) is a cyclic amino group or an organic group containing a cyclic amino group. The cyclic amino group is an amino group in which a nitrogen atom constituting the amino group is an atom also constituting a ring. There are a case where a nitrogen atom constituting a ring is bonded to a silicon atom directly or through a divalent linking group and another case where a carbon atom constituting a ring is bonded to a silicon atom directly or through a divalent linking group.

Examples of the cyclic amino group include aromatic heterocyclic amino groups of Formula (2).

In Formula (2), $A^1$, $A^2$, $A^3$, and $A^4$ are individually a carbon atom or a nitrogen atom, where at least one of $A^1$ to $A^4$ is a nitrogen atom, preferably one to three thereof is(are) (a) nitrogen atom(s). Examples of the substituent $R^4$ include an alkyl group, an aryl group, an aralkyl group, an alkenyl group, a hydroxy group, and a combination thereof. $R^4$s together may form a ring. Depending on whether each atom of $A^1$ to $A^4$ is a carbon atom or a nitrogen atom, or depending on to which atom of $A^1$ to $A^4$, a linking group bonded to a silicon atom is bonded, it is determined whether a bond between each atom of $A^1$ to $A^4$ and other atoms adjacent thereto and forming a ring together with $A^1$ to $A^4$ is a single bond or a double bond. In other words, whether the bond is a single bond or a double bond is determined by the valence of each atom so that the ring exhibits aromaticity.

With respect to each atom of $A^1$ to $A^4$, there are, depending on the bonding state of each of $A^1$ to $A^4$, a case where each of $A^1$ to $A^4$ has a hydrogen atom and another case where each of $A^1$ to $A^4$ has no hydrogen atom. Then, when each of $A^1$ to $A^4$ has a hydrogen atom, the substituent $R^4$ can be replaced by a hydrogen atom. Accordingly, m2 is 0 or a number selected from integers ranging from 1 to a maximum number that can be substituted on a monocycle or a polycycle. n1 is a number selected from integers of 1 to 8. m1 is a number selected from integers of 0 and 1. When n1 is 1, a 5-membered ring is formed; when n1 is 2, a 6-membered ring is formed; when n1 is 3, a 7-membered ring is formed; when n1 is 4, an 8-membered ring is formed; when n1 is 5, a 9-membered ring is formed; when n1 is 6, a 10-membered ring is formed; when n1 is 7, an 11-membered ring is formed; and when n1 is 8, a 12-membered ring is formed. When m1 is 0, the cyclic amino group is a monocycle and when m1 is 1, the cyclic amino group is a condensed ring. To any carbon atom or any nitrogen atom existing in the monocycle or the condensed ring, a silicon atom or a linking group bonded to a silicon atom is bonded to form a cyclic amino group or an organic group containing a cyclic amino group. The organic group containing a cyclic amino group is a divalent linking group between a cyclic amino group and a silicon atom and examples thereof include an alkylene group, an arylene group, and an alkenylene group.

Examples of the alkylene group include $C_{1-10}$ alkylene groups such as a methylene group, an ethylene group, a propylene group, an isopropylene group, a butylene group, and an octylene group. A divalent organic group derived from the chain or branched alkyl groups may be used as the alkylene group.

Examples of the alkylene group also include $C_{3-20}$ cycloalkylene groups such as a cyclopropylene group, a cyclobutylene group, and a cyclohexene group. A divalent organic group derived from the cyclic alkyl groups may be used as the alkylene group.

Examples of the arylene group include $C_{6-20}$ arylene groups such as a phenylene group, a naphthylene group, and an anthralene group. A divalent organic group derived from the aryl groups may be used as the arylene group.

As the alkenylene group, a divalent organic group derived from the alkenyl groups may be used as the alkenylene group.

Examples of the hydrolyzable organosilane of Formula (1) having an aromatic heterocyclic amino group of Formula (2) include organosilanes of Formulae below.

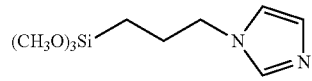

Formula (I-1)

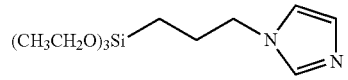

Formula (I-2)

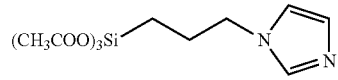

Formula (I-3)

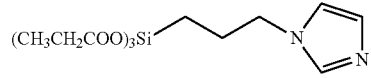

Formula (I-4)

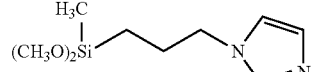

Formula (I-5)

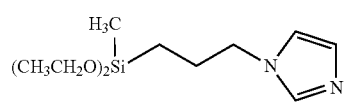

Formula (I-6)

Formula (I-7)

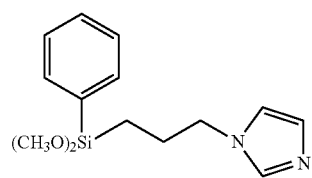

Formula (I-8)

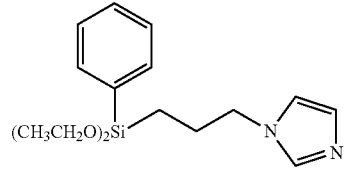

Formula (I-9)

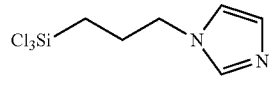

Formula (I-10)

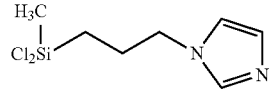

Formula (I-12)

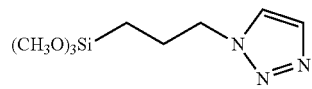

Formula (I-13)

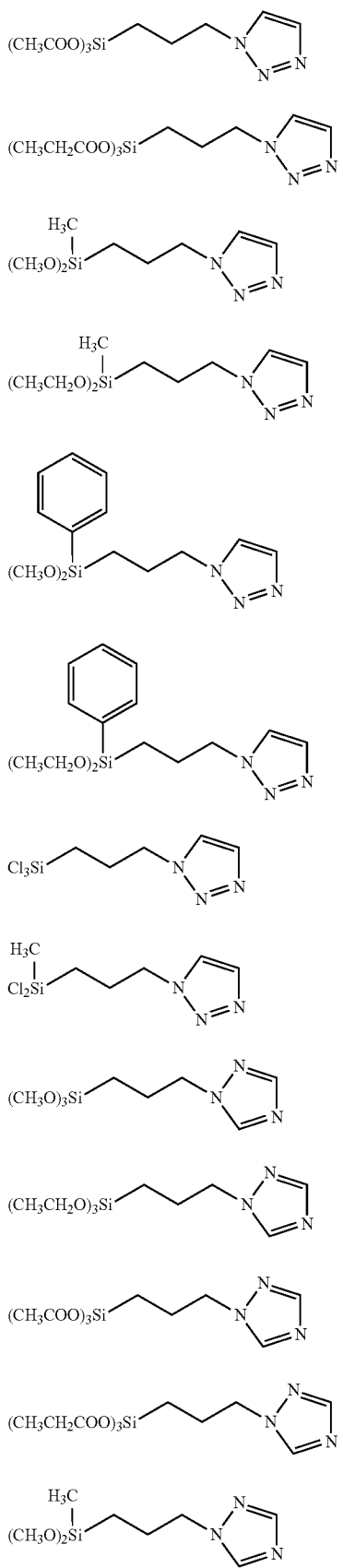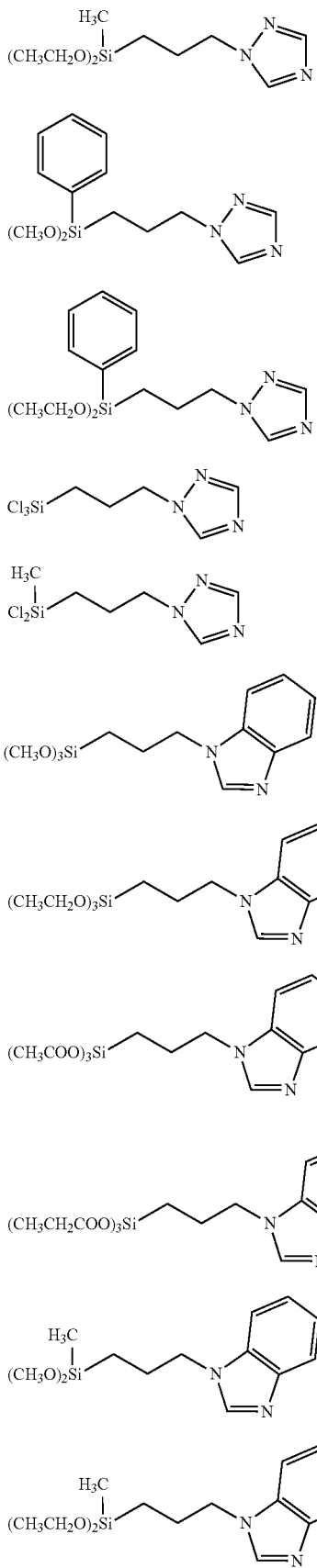

Formula (I-38)
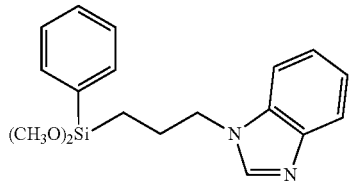
Formula (I-39)
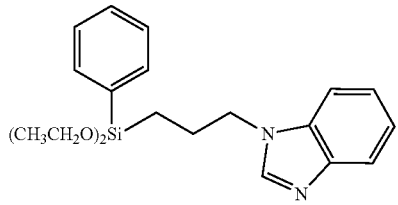
Formula (I-40)
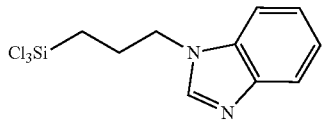
Formula (I-41)
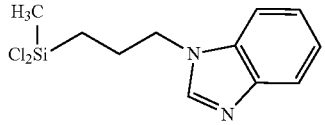
Formula (I-51)
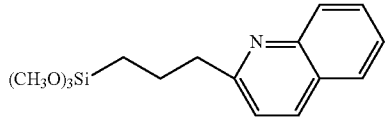
Formula (I-52)
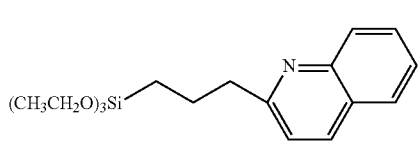
Formula (I-53)
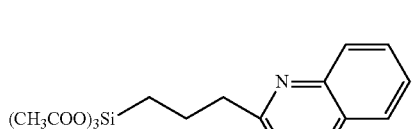
Formula (I-54)
Formula (I-55)
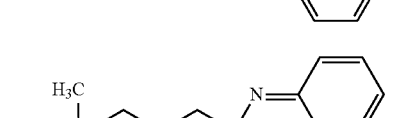
Formula (I-56)
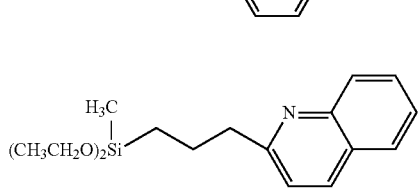
Formula (I-57)
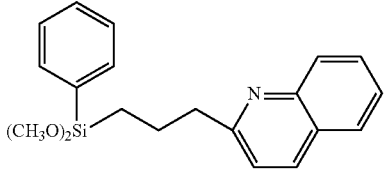
Formula (I-58)
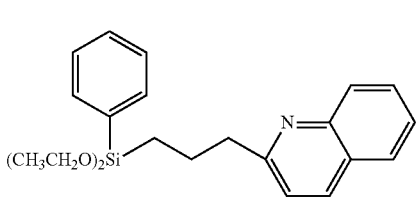
Formula (I-59)
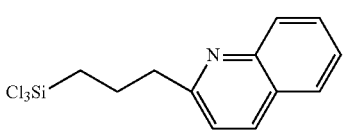
Formula (I-60)
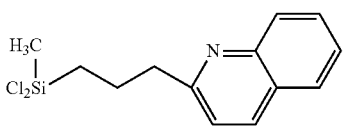
Formula (I-61)
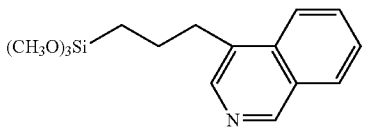
Formula (I-62)
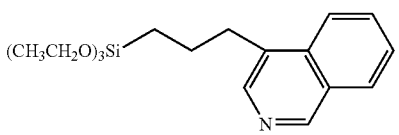
Formula (I-63)
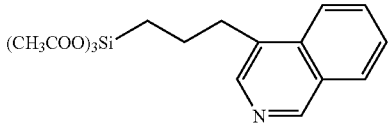
Formula (I-64)
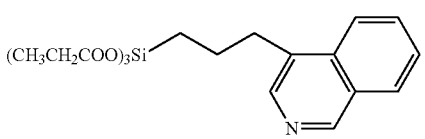
Formula (I-65)
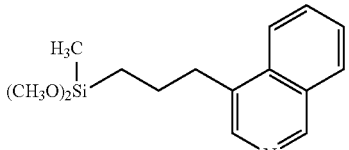
Formula (I-66)
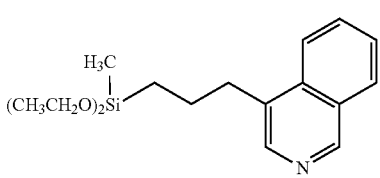

-continued

Formula (I-67)
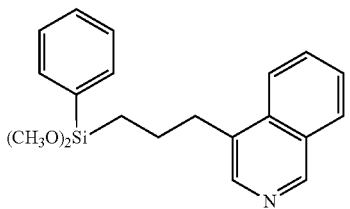

Formula (I-68)
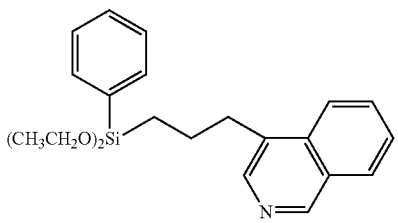

Formula (I-69)
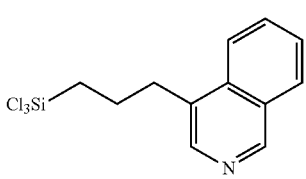

Formula (I-70)
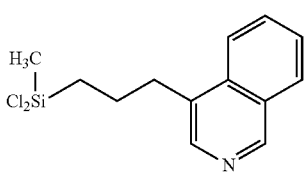

Formula (I-71)
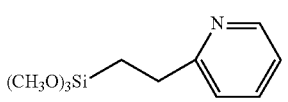

Formula (I-72)
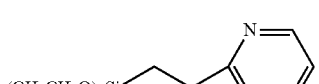

Formula (I-73)
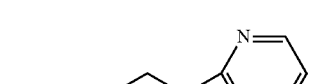

Formula (I-74)
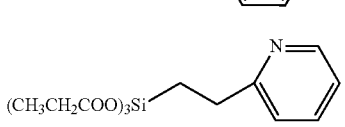

Formula (I-75)
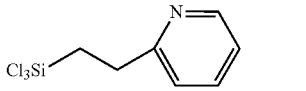

Formula (I-76)
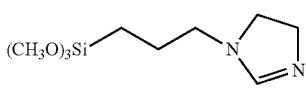

Formula (I-77)
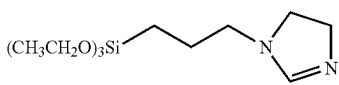

Formula (I-78)
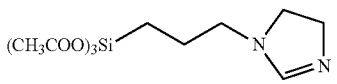

Formula (I-79)
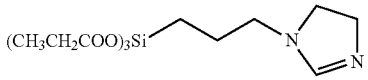

Formula (I-80)
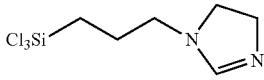

Examples of the cyclic amino group also include aliphatic heterocyclic amino groups of Formula (3).

In Formula (3), $A^5$, $A^6$, $A^7$, and $A^8$ are individually a carbon atom or a nitrogen atom, where at least one of $A^1$ to $A^4$ is a nitrogen atom, preferably 1 to 3 atom(s) thereof is(are) (a) nitrogen atom(s). Examples of the substituent $R^5$ include an alkyl group, an aryl group, an aralkyl group, an alkenyl group, a hydroxy group, and a combination thereof, where $R^5$s together may form a ring. When $R^5$s together form a ring, $R^5$s form a crosslinking ring structure such as cyclic amino groups having an adamantane ring, a norbornene ring, or a spiro ring.

Depending on whether each atom of $A^5$ to $A^8$ is a carbon atom or a nitrogen atom, or depending on to which atom of $A^5$ to $A^8$ a linking group bonded to a silicon atom is bonded, it is determined whether a bond between each atom of $A^5$ to $A^8$ and other atoms adjacent thereto and forming a ring together with $A^5$ to $A^8$ is a single bond or a double bond. In other words, whether the bond is a single bond or a double bond is determined by the valence of each atom so that the ring exhibits non-aromaticity.

With respect to each atom of $A^5$ to $A^8$, there are, depending on the bonding state of each of $A^5$ to $A^8$, a case where each of $A^5$ to $A^8$ has a hydrogen atom and another case where each of $A^5$ to $A^8$ has no hydrogen atom. When each of $A^5$ to $A^8$ has a hydrogen atom, the substituent $R^5$ can be replaced by a hydrogen atom. Accordingly, m4 is 0 or a number selected from integers ranging from 1 to a maximum number that can be substituted on a monocycle or a polycycle. n2 is a number selected from integers of 1 to 8. m3 is a number selected from integers of 0 and 1. When n2 is 1, a 5-membered ring is formed; when n2 is 2, a 6-membered ring is formed; when n2 is 3, a 7-membered ring is formed; when n2 is 4, an 8-membered ring is formed; when n2 is 5, a 9-membered ring is formed; when n2 is 6, a 10-membered ring is formed; when n2 is 7, an 11-membered ring is formed; and when n2 is 8, a 12-membered ring is formed. When m3 is 0, the cyclic amino group is a monocycle and when m3 is 1, the cyclic amino group is a condensed ring. To any carbon atom or any nitrogen atom existing in the monocycle or the condensed ring, a silicon atom or a linking group bonded to a silicon atom is bonded to form a cyclic amino group or an organic group containing a cyclic amino group. The organic group containing a cyclic amino group is a divalent linking group between a cyclic amino group and a silicon atom and examples thereof include an alkylene group, an arylene group, and an alkenylene group.

Examples of the alkylene group include $C_{1-10}$ alkylene groups such as a methylene group, an ethylene group, a propylene group, an isopropylene group, a butylene group, and an octylene group. A divalent organic group derived from the chain or branched alkyl groups may be used as the alkylene group.

Examples of the alkylene group also include $C_{3-20}$ cycloalkylene groups such as a cyclopropylene group, a cyclobutylene group, and a cyclohexene group. A divalent organic group derived from the cyclic alkyl groups may be used as the alkylene group.

Examples of the arylene group include $C_{6-20}$ arylene groups such as a phenylene group, a naphthylene group, and an anthralene group. A divalent organic group derived from the aryl groups may be used as the arylene group.

As the alkenylene group, a divalent organic group derived from the alkenyl groups may be used as the alkenylene group.

Examples of the hydrolyzable organosilane of Formula (1) having an aliphatic heterocyclic amino group of Formula (3) include organosilanes of Formulae below.

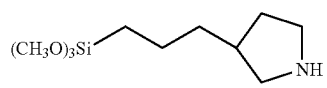
Formula (II-1)

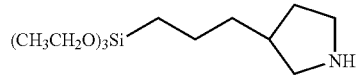
Formula (II-2)

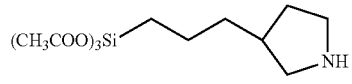
Formula (II-3)

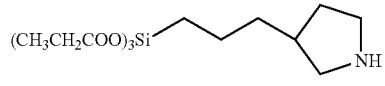
Formula (II-4)

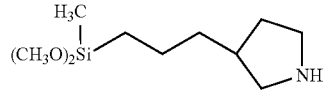
Formula (II-5)

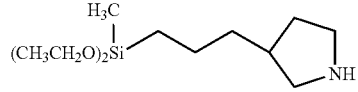
Formula (II-6)

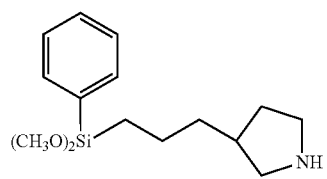
Formula (II-7)

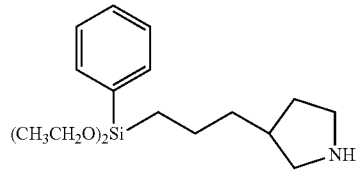
Formula (II-8)

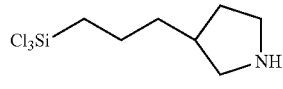
Formula (II-9)

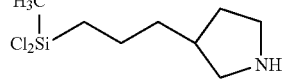
Formula (II-10)

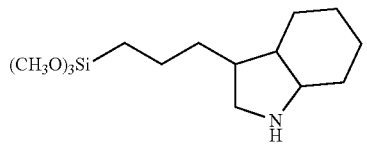
Formula (II-12)

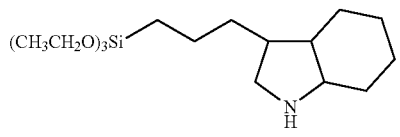
Formula (II-13)

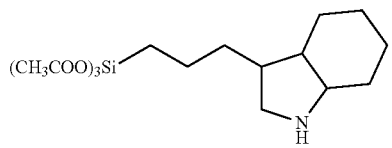
Formula (II-14)

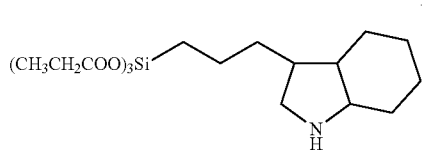
Formula (II-15)

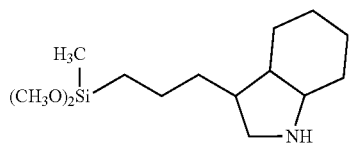
Formula (II-16)

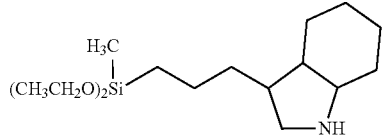
Formula (II-17)

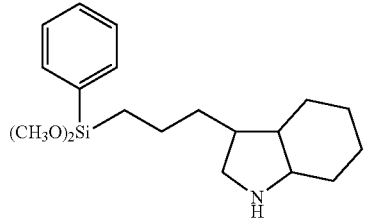
Formula (II-18)

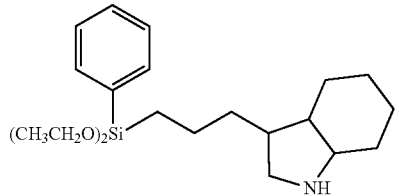
Formula (II-19)

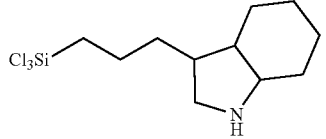
Formula (II-20)

Formula (II-21)
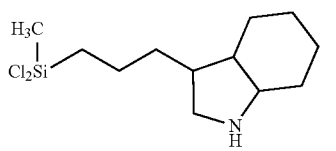
Formula (II-22)
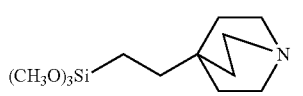
Formula (II-23)
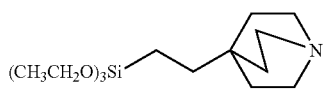
Formula (II-24)
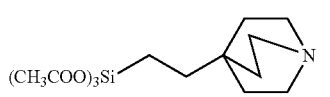
Formula (II-25)
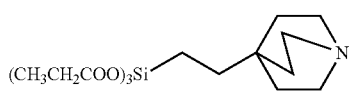
Formula (II-26)
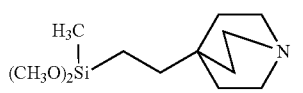
Formula (II-27)
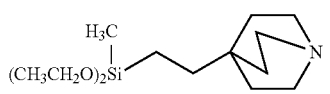
Formula (II-28)
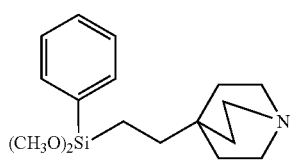
Formula (II-29)
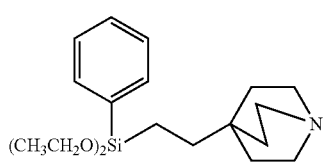
Formula (II-30)
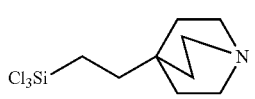
Formula (II-31)
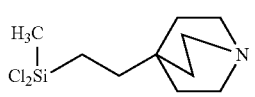
Examples of the hydrolysis-condensation product of the hydrolyzable organosilane of Formula (1) include hydrolysis-condensation products of Formulae below.
Formula (III-1)
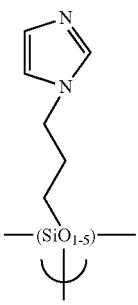
Formula (III-2)
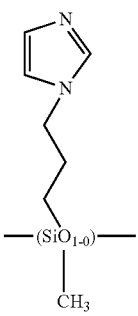
Formula (III-3)
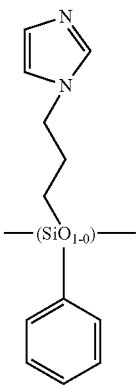
Formula (III-4)
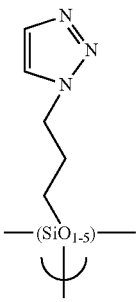
Formula (III-5)
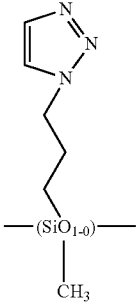

Formula (III-6)
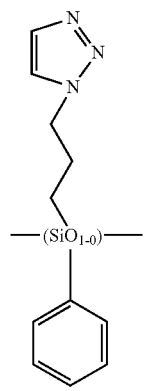
Formula (III-7)
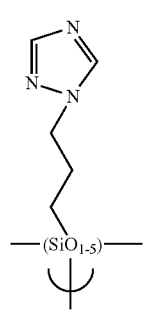
Formula (III-8)
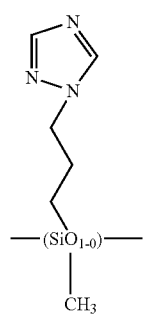
Formula (III-9)
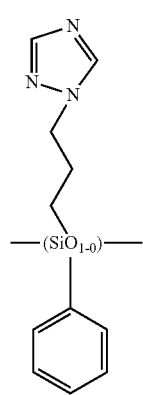
Formula (III-10)
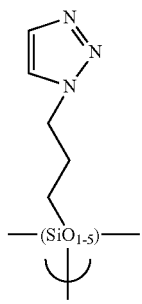
Formula (III-11)
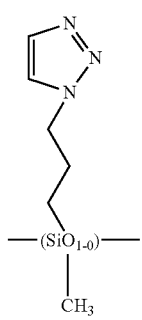
Formula (III-12)
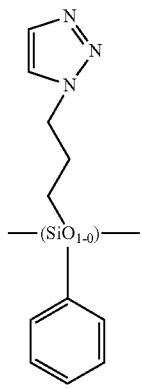
Formula (III-13)
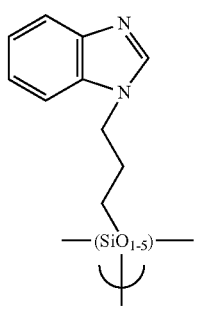
Formula (III-14)
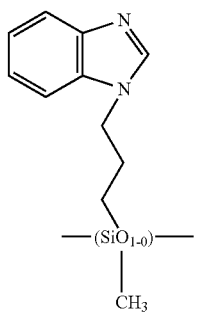

Formula (III-15)
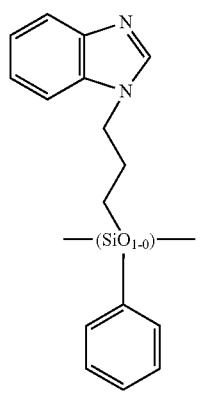
Formula (III-19)
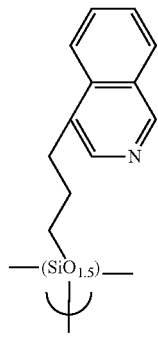
Formula (III-16)
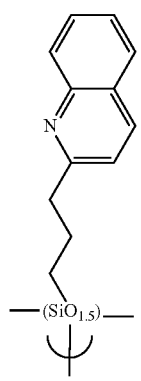
Formula (III-20)
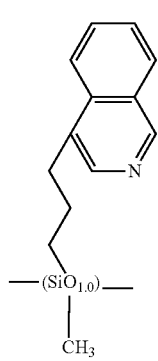
Formula (III-17)
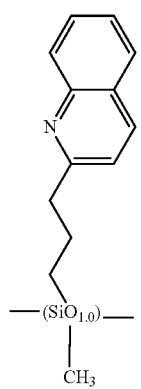
Formula (III-21)
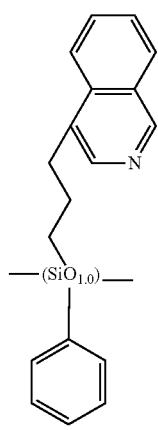
Formula (III-18)
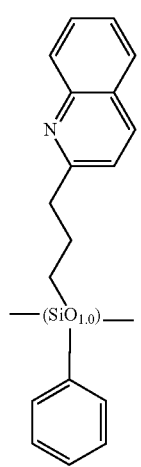
Formula (III-22)
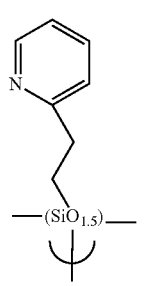

-continued
Formula (III-23)
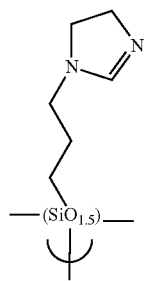
Formula (III-24)
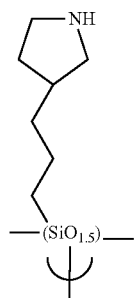
Formula (III-25)
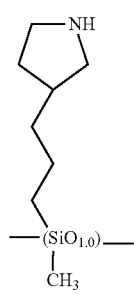
Formula (III-26)
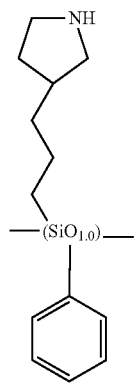
Formula (III-27)
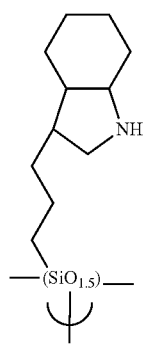
-continued
(Formula III-28)
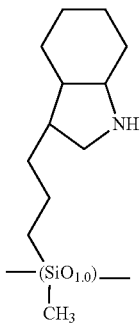
Formula (III-29)
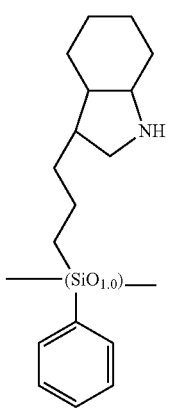
Formula (III-30)
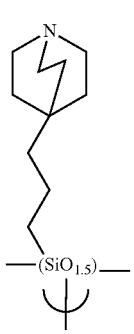
Formula (III-31)
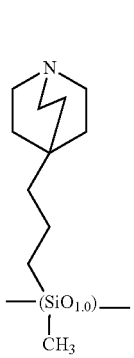

Formula (III-32)

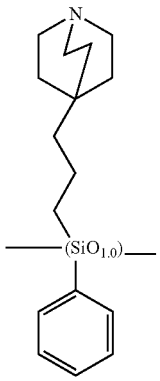

In the present invention, a hydrolyzable organosilane of Formula (1) can be used in combination with at least one type of silicon-containing compound selected from a group consisting of silicon-containing compounds of Formula (4) and Formula (5).

In other words, a hydrolyzable organosilane of Formula (1), a hydrolysis product thereof, or a hydrolysis-condensation product thereof can be used in combination with at least one type of silicon-containing compound selected from a group consisting of silicon-containing compounds of Formula (4) and Formula (5), a hydrolysis product thereof, or a hydrolysis-condensation product thereof.

The ratio between the hydrolyzable organosilane of Formula (1) and the silicon-containing compound(s) of Formula (4) and/or Formula (5) may be in a molar ratio in a range of 1:0 to 1:200. However, for obtaining an advantageous resist shape, it is preferred that the molar ratio is in a range of 0.01:99.99 to 0.95:99.05, preferably 0.01:99.99 to 0.50:99.50.

As the silicon-containing compound selected from a group consisting of silicon-containing compounds of Formula (4) and Formula (5), preferably used is a silicon-containing compound of Formula (4).

These compounds are preferably used as a hydrolysis-condensation product (polymer of polyorganosiloxane) thereof and it is preferred to use a hydrolysis-condensation product (polymer of polyorganosiloxane) of a hydrolyzable organosilane of Formula (1) with a silicon-containing compound of Formula (4).

Examples of the alkyl group, the aryl group, the halogenated alkyl group, the halogenated aryl group, the alkenyl group, and the organic group having an epoxy group, an acryloyl group, a methacryloyl group, a mercapto group, or a cyano group of $R^6$, $R^7$, $R^8$, and $R^9$ in the silicon-containing compounds of Formula (4) and Formula (5), and examples of the alkoxy group, the acyloxy group, and the halogen group contained in the hydrolyzable group include those described in Formula (1).

Examples of the silicon-containing compound of Formula (4) include tetramethoxysilane, tetrachlorosilane, tetraacetoxysilane, tetraethoxysilane, tetra n-propoxysilane, tetraisopropoxysilane, tetra n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Examples of the silicon-containing compound of Formula (5) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Specific examples of the hydrolysis-condensation product of the hydrolyzable organosilane of Formula (1) with the silicon-containing compound of Formula (4) include hydrolysis-condensation products of Formulae below.

Formula (IV-1)
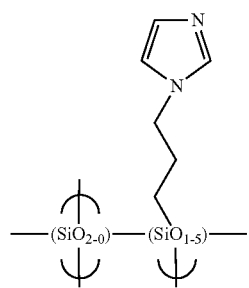

Formula (IV-2)
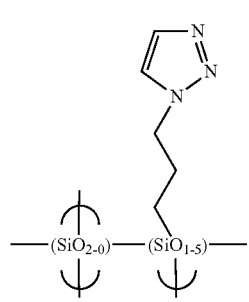

Formula (IV-3)
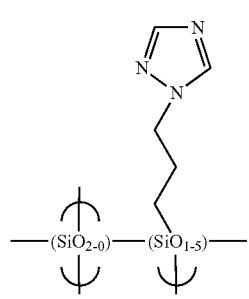

Formula (IV-4)
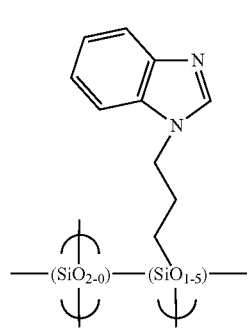

Formula (IV-5)
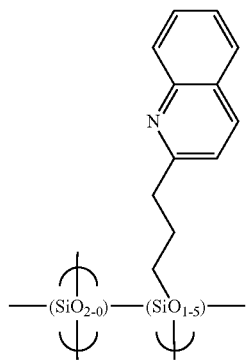

Formula (IV-6)
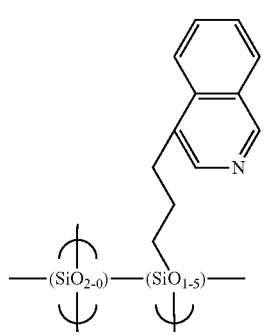

Formula (IV-7)
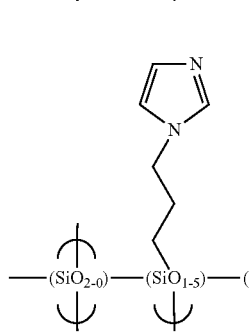

Formula (IV-8)
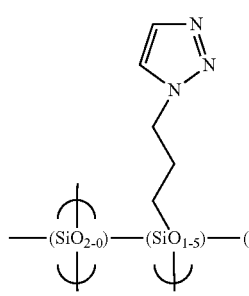

Formula (IV-9)
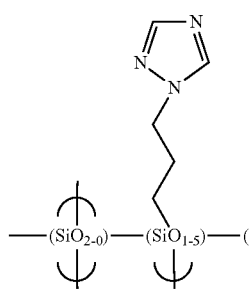

Formula (IV-10)

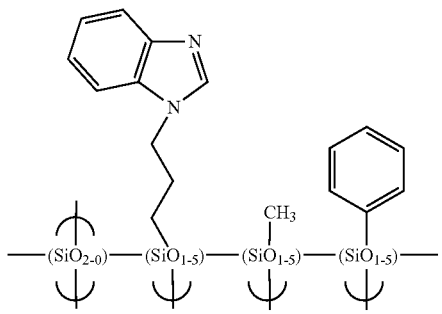

Formula (IV-11)

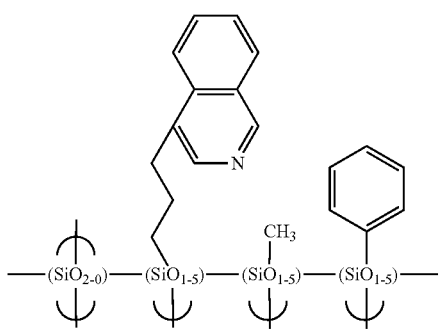

Formula (IV-12)

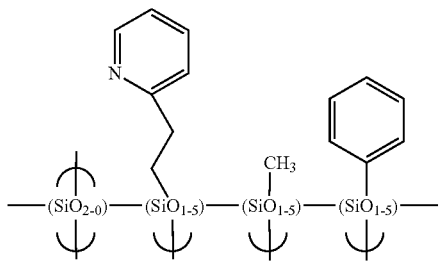

Formula (IV-13)

Formula (IV-14)

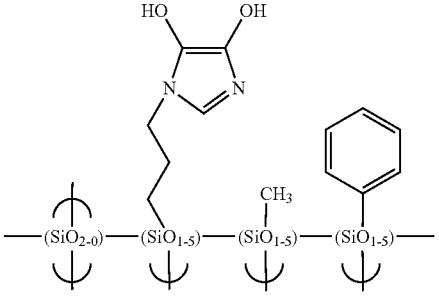

Formula (IV-15)

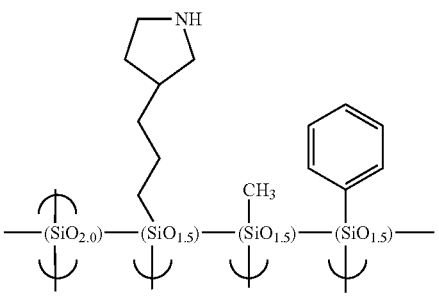

Formula (IV-16)

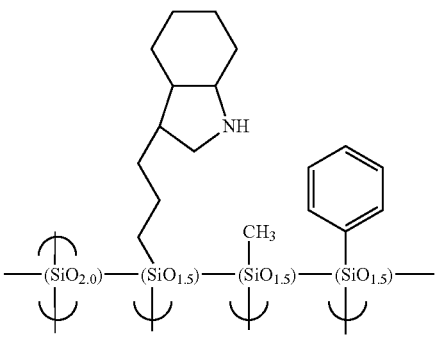

Formula (IV-17)

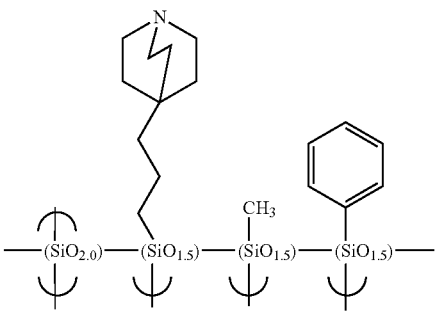

In the present invention, when an acid is used as a hydrolysis catalyst, a cyclic amino group or an organic group containing a cyclic amino group (such as an organic group containing an amino group) can adsorb protons in the used acid to be converted into an ammonium salt. All cyclic amino groups or a part of cyclic amino groups are (is) converted into an ammonium salt and the converted ammonium salt accelerates the condensation of a silanol group to accelerate the formation and the curing of a polymer of polyorganosiloxane. As the converted ammonium salt, when a secondary amine is used as the amine, a secondary ammonium salt is formed, and when a tertiary amine is used as the amine, a tertiary ammonium salt is formed. It is considered that by using, as the amine, an aromatic cyclic amino group or a cyclic amino group having an electron-donating group, a nitrogen atom of the amino group easily adsorbs protons and easily forms an ammonium salt. For example, when maleic acid is used as a hydrolysis catalyst, a counter anion of an ammonium salt converted from the amino group is a maleic acid ion, and when hydrochloric acid is used as a hydrolysis catalyst, a counter anion of the ammonium salt is a chlorine ion. When taking the hydrolysis-condensation products of Formulae (IV-1) to (IV-15) as an example, it is considered that an ammonium salt having a structure of, for example, Formulae below is formed.

Formula (V-1)

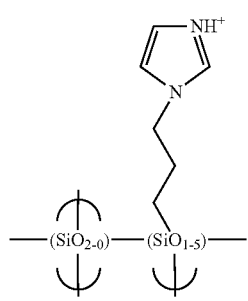

Formula (V-2)

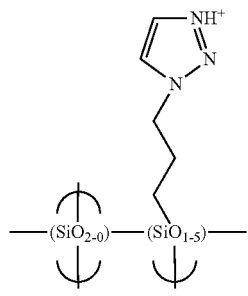

Formula (V-3)

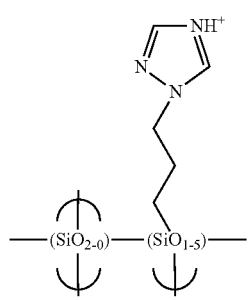

Formula (V-4)

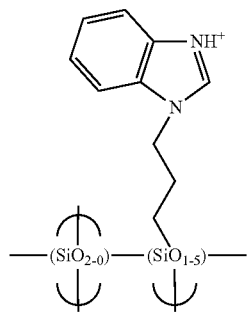

Formula (V-5)

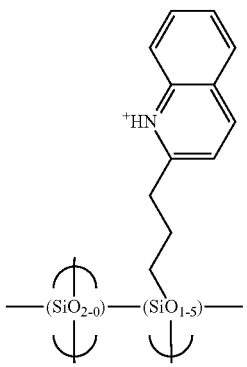

Formula (V-6)

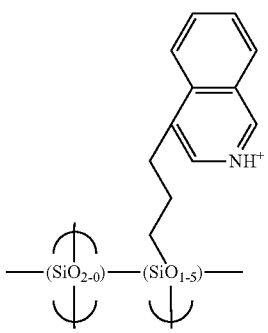

Formula (V-7)

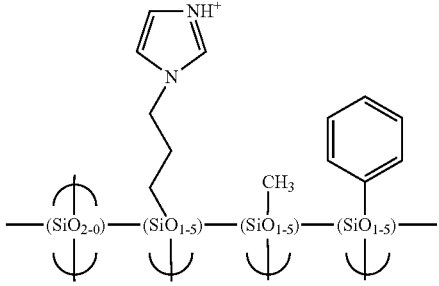

Formula (V-8)

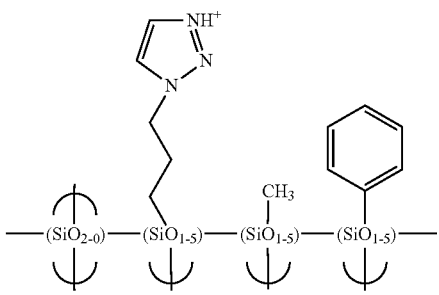

Formula (V-9)

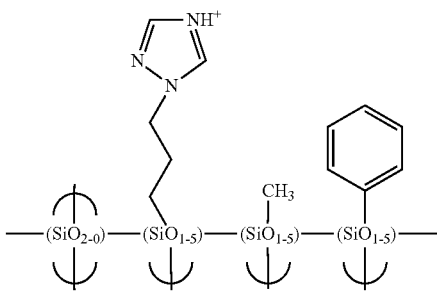

Formula (V-10)

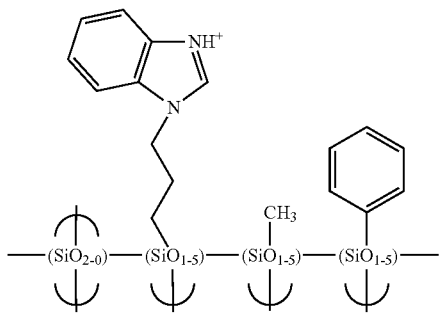

Formula (V-11)

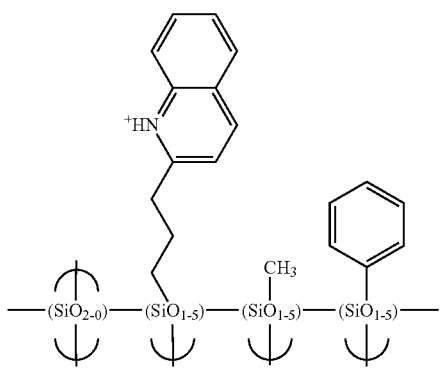

Formula (V-12)

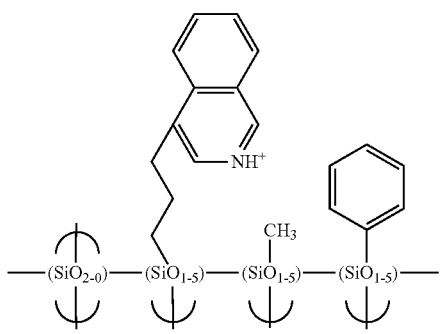

Formula (V-13)

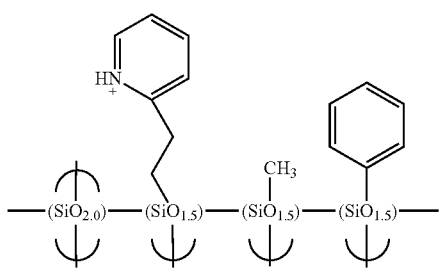

Formula (V-14)

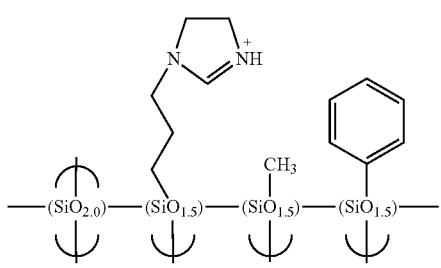

Formula (V-15)

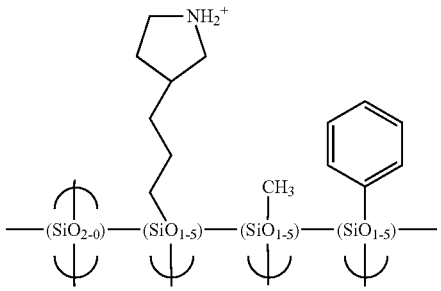

Formula (V-16)

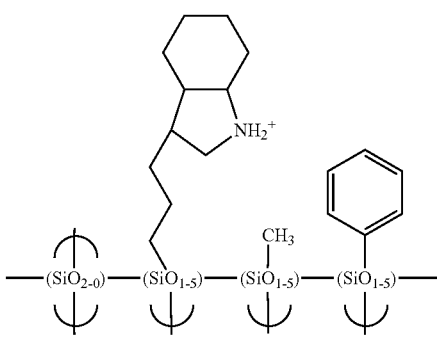

Formula (V-17)

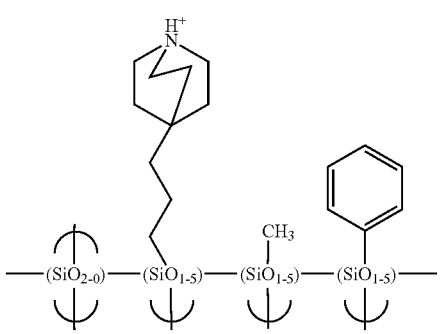

As the hydrolysis-condensation product (polyorganosiloxane) of the hydrolyzable organosilane of Formula (1) or the hydrolysis-condensation product (polyorganosiloxane) of the hydrolyzable organosilane of Formula (1) with the organic silicon compound(s) of Formula (4) and/or Formula (5), a condensation product having a weight average molecular weight of 1,000 to 1,000,000 or 1,000 to 100,000 can be obtained. This molecular weight is a molecular weight obtained by a GPC analysis and converted into that of polystyrene.

Examples of the condition for the GPC measurement include: using a GPC apparatus (trade name: HLC-8220GPC; manufactured by Tosoh Corporation); using a GPC column (trade names: Shodex KF803L, KF802, and KF801; manufactured by Showa Denko K.K.); using a column temperature of 40° C.; using tetrahydrofuran as the eluting liquid (eluting solvent); using a flow amount (flow rate) of 1.0 mL/min; and using polystyrene (manufactured by Showa Denko K.K.) as the standard sample.

For the hydrolysis of an alkoxysilyl group or an acyloxysilyl group, water is used in an amount of 0.5 to 100 mol, preferably 1 to 10 mol, relative to 1 mol of a hydrolyzable group.

A hydrolysis catalyst can be used in an amount of 0.001 to 10 mol, preferably 0.001 to 1 mol, relative to 1 mol of a hydrolyzable group.

The reaction temperature for performing the hydrolysis and the condensation is usually 20 to 80° C.

The hydrolysis may be performed either completely or partially. That is, in the hydrolysis-condensation product thereof, a hydrolysis product or a monomer may remain.

During the hydrolysis and the condensation, a catalyst can be used.

Examples of the catalyst for the hydrolysis include metal chelate compounds, organic acids, inorganic acids, organic bases, and inorganic bases.

Examples of the metal chelate compound as the catalyst for the hydrolysis include: titanium chelate compounds such as triethoxy-mono(acetylacetonate)titanium, tri-n-propoxy-mono(acetylacetonate)titanium, triisopropoxy-mono(acetylacetonate)titanium, tri-n-butoxy-mono(acetylacetonate)titanium, tri-sec-butoxy-mono(acetylacetonate)titanium, tri-tert-butoxy-mono(acetylacetonate)titanium, diethoxy-bis(acetylacetonate)titanium, di-n-propoxy-bis(acetylacetonate)titanium, di-isopropoxy-bis(acetylacetonate)titanium, di-n-butoxy-bis(acetylacetonate)titanium, di-sec-butoxy-bis(acetylacetonate)titanium, di-tert-butoxy-bis(acetylacetonate)titanium, monoethoxy-tris(acetylacetonate)titanium, mono-n-propoxy-tris(acetylacetonate)titanium, mono-isopropoxy-tris(acetylacetonate)titanium, mono-n-butoxy-tris(acetylacetonate)titanium, mono-sec-butoxy-tris(acetylacetonate)titanium, mono-tert-butoxy-tris(acetylacetonate)titanium, tetrakis(acetylacetonate)titanium, triethoxy-mono(ethylacetoacetate)titanium, tri-n-propoxy-mono(ethylacetoacetate)titanium, tri-isopropoxy-mono(ethylacetoacetate)titanium, tri-n-butoxy-mono(ethylacetoacetate)titanium, tri-sec-butoxy-mono(ethylacetoacetate)titanium, tri-tert-butoxy-mono(ethylacetoacetate)titanium, diethoxy-bis(ethylacetoacetate)titanium, di-n-propoxy-bis(ethylacetoacetate)titanium, di-isopropoxy-bis(ethylacetoacetate)titanium, di-n-butoxy-bis(ethylacetoacetate)titanium, di-sec-butoxy-bis(ethylacetoacetate)titanium, di-tert-butoxy-bis(ethylacetoacetate)titanium, monoethoxy-tris(ethylacetoacetate)titanium, mono-n-propoxy-tris(ethylacetoacetate)titanium, mono-isopropoxy-tris(ethylacetoacetate)titanium, mono-n-butoxy-tris(ethylacetoacetate)titanium, mono-sec-butoxy-tris(ethylacetoacetate)titanium, mono-tert-butoxy-tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy-mono(acetylacetonate)zirconium, tri-n-propoxy-mono(acetylacetonate)zirconium, tri-isopropoxy-mono(acetylacetonate)zirconium, tri-n-butoxy-mono(acetylacetonate)zirconium, tri-sec-butoxy-mono(acetylacetonate)zirconium, tri-tert-butoxy-mono(acetylacetonate)zirconium, diethoxy-bis(acetylacetonate)zirconium, di-n-propoxy-bis(acetylacetonate)zirconium, di-isopropoxy-bis(acetylacetonate)zirconium, di-n-butoxy-bis(acetylacetonate)zirconium, di-sec-butoxy-bis(acetylacetonate)zirconium, di-tert-butoxy-bis(acetylacetonate)zirconium, monoethoxy-tris(acetylacetonate)zirconium, mono-n-propoxy-tris(acetylacetonate)zirconium, mono-isopropoxy-tris(acetylacetonate)zirconium, mono-n-butoxy-tris(acetylacetonate)zirconium, mono-sec-butoxy-tris(acetylacetonate)zirconium, mono-tert-butoxy-tris(acetylacetonate)zirconium, tetrakis(acetylacetonate)zirconium, triethoxy-mono(ethylacetoacetate)zirconium, tri-n-propoxy-mono(ethylacetoacetate)zirconium, tri-isopropoxy-mono(ethylacetoacetate)zirconium, tri-n-butoxy-mono(ethylacetoacetate)zirconium, tri-sec-butoxy-mono(ethylacetoacetate)zirconium, tri-tert-butoxy-mono(ethylacetoacetate)zirconium, diethoxy-bis(ethylacetoacetate)zirconium, di-n-propoxy-bis(ethylacetoacetate)zirconium, di-isopropoxy-bis(ethylacetoacetate)zirconium, di-n-butoxy-bis(ethylacetoacetate)zirconium, di-sec-butoxy-bis(ethylacetoacetate)zirconium, di-tert-butoxy-bis(ethylacetoacetate)zirconium, monoethoxy-tris(ethylacetoacetate)zirconium, mono-n-propoxy-tris(ethylacetoacetate)zirconium, mono-isopropoxy-tris(ethylacetoacetate)zirconium, mono-n-butoxy-tris(ethylacetoacetate)zirconium, mono-sec-butoxy-tris(ethylacetoacetate)zirconium, mono-tert-butoxy-tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum.

Examples of the organic acid as the catalyst for the hydrolysis include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the catalyst for the hydrolysis include hydrochloric acid, nitric acid, sulfuric acid, hydrofluoric acid, and phosphoric acid.

Examples of the organic base as the catalyst for the hydrolysis include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo octane, diazabicyclo nonane, diazabicyclo undecene, and tetramethylammoniumhydroxide. Examples of the inorganic base include ammonia, sodium hydroxide, potassium hydroxide, barium hydroxide, and calcium hydroxide. Among these catalysts, metal chelate compounds, organic acids, and inorganic acids are preferred and these catalysts may be used individually or in combination of two or more types thereof.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyalcohol solvents such as ethylene glycol, propylene glycol, 1,3-butylene glycol, pentanediol-2,4, 2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone. These solvents may be used individually or in combination of two or more types thereof.

Particularly, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol mono-ethyl ether acetate, and propylene glycol monopropyl ether acetate are preferred in terms of the preservation stability of the solution thereof.

From the hydrolysis-condensation product (polymer) obtained by hydrolyzing and condensing a hydrolyzable organosilane in a solvent using a catalyst, an alcohol as a by-product, the used hydrolyzing catalyst, and the used water can be simultaneously removed by distillation under reduced pressure or the like. An acid or base catalyst used for the hydrolysis can be removed by neutralization or ion exchange. Then, to the resist underlayer film forming composition for lithography of the present invention containing the hydrolysis-condensation product thereof, an organic acid, water, an alcohol, or a combination thereof can be added to stabilize the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferred. The amount of the organic acid to be blended in is 0.5 to 5.0 parts by mass, relative to 100 parts by mass of the condensation product (polyorganosiloxane). As the water to be blended in, pure water, ultrapure water, ion-exchanged water, or the like can be used and the blended amount thereof can be 1 to 20 part(s) by mass, relative to 100 parts by mass of the resist underlayer film forming composition.

As the alcohol to be blended in, an alcohol that is easily scattered by heating after application is preferred and examples thereof include methanol, ethanol, propanol, isopropanol, and butanol. The amount of the alcohol to be blended in can be 1 to 20 part(s) by mass, relative to 100 parts by mass of the resist underlayer film forming composition.

The underlayer film forming composition for lithography of the present invention may contain, if necessary, organic polymer compounds, photoacid generators, surfactants, and the like, besides the components mentioned above.

By using an organic polymer compound, there can be controlled the dry etching rate (a decreased amount of the film thickness per unit time), the attenuation coefficient, the refractive index, and the like of a resist underlayer film formed from the underlayer film forming composition for lithography of the present invention.

The organic polymer compound is not particularly limited and various organic polymers such as condensation polymerization polymers and addition polymerization polymers can be used. As the organic polymer compound, there can be used addition polymerization polymers and condensation polymerization polymers such as polyesters, polystyrenes, polyimides, acrylic polymers, methacrylic polymers, polyvinylethers, phenolnovolacs, naphtholnovolacs, polyethers, polyamides, and polycarbonates. There are preferably used an organic polymer having an aromatic ring structure functioning as a light absorbing moiety such as a benzene ring, a naphthalene ring, an anthracene ring, a triazine ring, a quinoline ring, and a quinoxaline ring.

Examples of such an organic polymer compound include addition polymerization polymers containing, as a structure unit thereof, an addition polymerizable monomer such as benzylacrylate, benzylmethacrylate, phenylacrylate, naphthylacrylate, anthrylmethacrylate, anthrylmethylmethacrylate, styrene, hydroxystyrene, benzylvinyl ether, and N-phenylmaleimide, and condensation polymerization polymers such as phenolnovolacs and naphtholnovolacs.

When an addition polymerization polymer is used as the organic polymer compound, the polymer compound may be either a homopolymer or a copolymer. For producing the addition polymerization polymer, an addition polymerizable monomer is used. Examples of such an addition polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride, and acrylonitrile.

Examples of the acrylic acid ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methmethacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

When a condensation polymerization polymer is used as the polymer, examples of such a polymer include condensation polymerization polymers of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polymer also include polyesters, polyamides, and polyimides such as polypyromellitimide, poly(p-phenyleneterephthalamide), polybutyleneterephthalate, and polyethyleneterephthalate.

When the organic polymer compound contains a hydroxy group, the hydroxy group can effect a crosslinking reaction with a polyorganosiloxane.

As the organic polymer compound, there can be used a polymer compound having a weight average molecular weight of, for example, 1,000 to 1,000,000, or 3,000 to 300,000, or 5,000 to 200,000, or 10,000 to 100,000.

The organic polymer compounds may be used individually or in combination of two or more types thereof.

When the organic polymer compound is used, the content thereof is 1 to 200 parts by mass, or 5 to 100 parts by mass, or 10 to 50 parts by mass, or 20 to 30 parts by mass, relative to 100 parts by mass of the condensation product (polyorganosiloxane).

The resist underlayer film forming composition of the present invention may contain an acid generator.

Examples of the acid generator include thermoacid generators and photoacid generators.

The photoacid generator generates an acid during exposure of the resist. Therefore, the acidity of the underlayer film can be controlled. This is one method for adjusting the acidity of the underlayer film to that of the resist on the underlayer film. By adjusting the acidity of the underlayer film, the pattern shape of the resist formed thereon can be controlled.

Examples of the photoacid generator contained in the resist underlayer film forming composition of the present invention include onium salt compounds, sulfonimide compounds, and disulfonyl diazomethane compounds.

Examples of the onium salt compound include: iodonium salt compounds such as diphenyliodoniumhexafluorophosphate, diphenyliodoniumtrifluoromethanesulfonate, diphenyliodoniumnonafluoro normal butane sulfonate, diphenyliodoniumperfluoro normal octane sulfonate, diphenyliodoniumcamphorsulfonate, bis(4-tert-butylphenyl)iodoniumcamphorsulfonate, and bis(4-tert-butylphenyl)iodoniumtrifluoromethanesulfonate; and sulfonium salt compounds such as triphenylsulfoniumhexafluoroantimonate, triphenylsulfoniumnonafluoro normal butane sulfonate, triphenylsulfoniumcamphorsulfonate, and triphenylsulfoniumtrifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis (phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These photoacid generators may be used individually or in combination of two or more types thereof.

When the photoacid generator is used, the content thereof is 0.01 to 5 parts by mass, or 0.1 to 3 parts by mass, or 0.5 to 1 part(s) by mass, relative to 100 parts by mass of the condensation product (polyorganosiloxane).

The surfactant is effective for suppressing the formation of a pin hole, a striation, and the like when the resist underlayer film forming composition for lithography of the present invention is applied on a substrate.

Examples of the surfactant contained in the resist underlayer film forming composition of the present invention include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP EF301, EF303, and EF352 (trade name; manufactured by Tohkem Products Corp.), MEGAFAC F171, F173, R-08, and R-30 (trade name; manufactured by Dainippon Ink and Chemicals, Inc.), Fluorad FC430 and FC431 (trade name; manufactured by Sumitomo 3M Limited), AsahiGuard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.). These surfactants may be used individually or in combination of two or more types thereof. When the surfactant is used, the content thereof is 0.0001 to 5 parts by mass, or 0.001 to 1 part(s) by mass, or 0.01 to 0.5 parts by mass, relative to 100 parts by mass of the condensation product (polyorganosiloxane).

In the resist underlayer film forming composition of the present invention, a rheology controlling agent and an adhesion assistant may be blended. The rheology controlling agent is effective for enhancing the fluidity of the underlayer film forming composition. The adhesion assistant is effective for enhancing the adhesion of the underlayer film to the semiconductor substrate or the resist.

The solvent used for the resist underlayer film forming composition of the present invention is not particularly limited so long as the solvent can dissolve the solid content. Examples of such a solvent include methyl cellosolve acetate, ethyl cellosolve acetate, propylene glycol, propylene glycol monomethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, and γ-butyrolactone. These solvents may be used individually or in combination of two or more types thereof.

The use of the resist underlayer film forming composition of the present invention is described hereinafter.

The resist underlayer film forming composition of the present invention is applied on a substrate used in the production of semiconductor devices (for example, silicon wafer substrates, silicon/silicon dioxide coated substrates, silicon nitride substrates, glass substrates, ITO substrates, polyimide substrates, low dielectric constant material (low-k material) coated substrates, etc.) by an appropriate coating method such as a spinner and a coater and, then, is baked to form a resist underlayer film. The baking conditions are accordingly selected from baking temperatures of 80° C. to 250° C. and baking times of 0.3 to 60 minutes. Preferably, the baking temperature is 150° C. to 250° C. and the baking time is 0.5 to 2 minutes. Here, the formed underlayer film has a film thickness of, for example, 10 to 1,000 nm, or 20 to 500 nm, or 50 to 300 nm, or 100 to 200 nm.

Next, on the resist underlayer film, for example a photoresist layer is formed. The formation of the photoresist layer can be performed by a known method, that is, by applying a photoresist composition solution on the underlayer film and by baking the composition solution. The photoresist has a film thickness of, for example, 50 to 10,000 nm, or 100 to 2,000 nm, or 200 to 1,000 nm.

The photoresist formed on the resist underlayer film of the present invention is not particularly limited so long as the photoresist is sensitive to a light used for the exposure, and both of a negative-type photoresist and a positive-type photoresist can be used. Examples of the photoresist include: a positive-type photoresist made of a novolac resin and 1,2-naphthoquinonediazide sulfonic acid ester; a chemical amplification-type photoresist made of a binder having a group elevating the alkali dissolving rate by being decomposed by an acid, and a photoacid generator; a chemical amplification-type photoresist made of a low molecule compound elevating the alkali dissolving rate of a photoresist by being decomposed by an acid, an alkali-soluble binder, and a photoacid generator; and a chemical amplification-type photoresist made of a binder having a group elevating the alkali dissolving rate by being decomposed by an acid, a low molecule compound elevating the alkali dissolving rate of a photoresist by being decomposed by an acid, and a photoacid generator. Examples of the photoresist include trade name: APEX-E manufactured by Shipley Company, L.L.C., trade name: PAR710 manufactured by Sumitomo Chemical Co., Ltd., and trade name: SEPR430 manufactured by Shin-Etsu Chemical Co., Ltd. The examples also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, the exposure is performed through a predetermined mask. For the exposure, a KrF excimer laser (wavelength: 248 nm), an ArF excimer laser (wavelength: 193 nm), a F2 excimer laser (wavelength: 157 nm), and the like can be used. After the exposure, if necessary, post exposure bake can also be performed. The post exposure bake is performed under conditions accordingly selected from baking temperatures of 70° C. to 150° C. and baking times of 0.3 to 10 minutes.

In the present invention, as the resist, a resist for electron beam lithography can be used instead of the photoresist. As the electron beam resist, both a positive type and a negative type can be used. Examples of the electron beam resist include: a chemical amplification-type resist made of a binder having a group changing the alkali dissolving rate by being decomposed by an acid generator and an acid; a chemical amplification-type resist made of an alkali-soluble binder and a low molecule compound changing the alkali dissolving rate of a resist by being decomposed by an acid generator and an acid; a chemical amplification-type resist made of a binder having a group changing the alkali dissolving rate by being decomposed by an acid generator and an acid, and a low molecule compound changing the alkali dissolving rate of a resist by being decomposed by an acid; a non-chemical amplification-type resist made of a binder having a group changing the alkali dissolving rate by being decomposed by an electron beam; and a non-chemical amplification-type resist made of a binder having a moiety changing the alkali dissolving rate by being broken by an electron beam. Also in the case of using the electron beam resist, a resist pattern can be formed in the same manner as in the case of using a photoresist, by using an electron beam as the radiating source.

Next, development is performed by a developer. Consequently, for example when a positive-type photoresist is used, the photoresist of an exposed part is removed to form a photoresist pattern.

Examples of the developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Furthermore, in these developers, a surfactant and the like may also be blended. The conditions for the development are accordingly selected from temperatures of 5 to 50° C. and times of 10 to 600 seconds.

Then, using the thus formed pattern of the photoresist (upper layer) as a protecting film, the removal of the resist underlayer film (intermediate layer) of the present invention is performed and, subsequently, using the film composed of the patterned photoresist and the patterned resist underlayer film (intermediate layer) of the present invention as a protecting film, the removal of the organic underlayer film (underlayer) is performed. Finally, using the patterned resist underlayer film (intermediate layer) of the present invention and the patterned organic underlayer film (underlayer) as a protecting film, the processing of the semiconductor substrate is performed.

First, the resist underlayer film (intermediate layer) of the present invention at the part where the photoresist is removed is removed by dry etching to expose the semiconductor substrate. For dry etching the resist underlayer film of the present invention, there can be used gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane. For dry etching the resist underlayer film, a halogen-based gas is preferably used. By dry etching with a halogen-based gas a photoresist composed of organic substances is fundamentally difficult to be removed. On the contrary, the resist underlayer film of the present invention containing a large amount of silicon atoms is immediately removed by a halogen-based gas. Therefore, the decrease of the film thickness of the photoresist according to dry etching of the resist underlayer film can be suppressed. Then, as the result, the photoresist can be used as a thin film. The resist underlayer film is dry-etched preferably with a fluorine-based gas and examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Subsequently, using the film composed of the patterned photoresist and the patterned resist underlayer film of the present invention as a protecting film, the removal of the organic underlayer film is performed. The removal of the organic underlayer film (underlayer) is performed by dry etching preferably with an oxygen-based gas. This is because the resist underlayer film of the present invention containing a large amount of silicon atoms is difficult to be removed by dry etching with an oxygen-based gas.

Finally, the processing of the semiconductor substrate is performed. The processing of the semiconductor substrate is performed by dry etching preferably with a fluorine-based gas.

Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

On the resist underlayer film of the present invention, an organic bottom anti-reflective coating can be formed before the formation of the photoresist. The bottom anti-reflective coating composition used here is not particularly limited and can be optionally selected from the compositions commonly used in a conventional lithography process to be used. The formation of the bottom anti-reflective coating can be performed by a commonly used method, for example, by applying a bottom anti-reflective coating composition by a spinner or a coater and by baking the composition.

In the present invention, after forming of the organic underlayer film on the substrate, the resist underlayer film of the present invention can be formed on the organic underlayer film, and further, the resist underlayer film can be coated with the photoresist. Thus, even when the pattern width of the photoresist becomes smaller and the photoresist is coated thinly for preventing a pattern collapse, the processing of the substrate becomes possible by selecting an appropriate etching gas. For example, the resist underlayer film of the present invention can be processed by using, as an etching gas, a fluorine-based gas having an etching rate of the resist underlayer film satisfactorily higher than that of the photoresist, and the organic underlayer film can be processed by using, as an etching gas, an oxygen-based gas having an etching rate of the organic underlayer film satisfactorily higher than that of the resist underlayer film of the present invention. Furthermore, the substrate can be processed by using, as an etching gas, a fluorine-based gas having an etching rate of the substrate satisfactorily higher than that of the organic underlayer film.

The substrate on which the resist underlayer film forming composition of the present invention is applied may also be a substrate having an organic or inorganic bottom anti-reflective coating formed by a CVD method on its surface and, on the bottom anti-reflective coating, the underlayer film of the present invention can also be formed.

A resist underlayer film formed from the resist underlayer film forming composition of the present invention may absorb a light used in a lithography process depending on the wavelength of the light. Then, in such a case, the resist underlayer film can function as a bottom anti-reflective coating having the effect of preventing a light reflected on the substrate. Furthermore, the underlayer film of the present invention can also be used as a layer for preventing an interaction between the substrate and the photoresist, a layer having a function of preventing an adverse action of a material used in the photoresist or of a substance generated during exposure of the photoresist against the substrate, a layer having a function of preventing the diffusion of a substance generated in or on the substrate during heating and baking to the upper layer photoresist, a barrier layer for reducing a poisoning effect to the photoresist layer by a semiconductor substrate dielectric layer, and the like.

A resist underlayer film formed from the resist underlayer film forming composition can be applied to a substrate in which a via hole used in the dual damascene process is formed to be used as an embedding material capable of filling the hole without a void. The resist underlayer film can also be used as a planarizing material for planarizing the surface of a semiconductor substrate having unevenness.

The present invention will be more specifically described hereinafter, referring to Examples which should not be construed as limiting the scope of the present invention.

EXAMPLES

Synthesis Example 1

4.95 g of phenyltrimethoxysilane, 72.25 g of tetraethoxysilane, 22.24 g of methyltriethoxysilane, 0.57 g of 2-(trimethoxysilylethyl)pyridine, and 150 g of acetone were charged into a 500 mL flask to be dissolved and the resultant mixed solution was warmed while stirring the mixed solution with a magnetic stirrer to reflux. Next, an aqueous solution in which 0.58 g of maleic acid was dissolved in 33.20 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, and water were distilled off under reduced pressure to obtain a hydrolysis-condensation product. The polymer thus obtained corresponds to a polymer containing a group of silane structure units of Formula (VI-1):

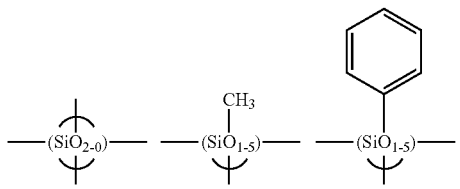

Formula (VI-1)

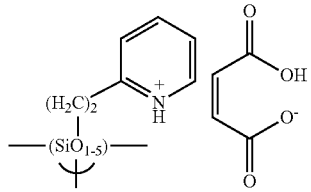

-continued which is a polysiloxane in which a silane having a cyclic amino group is contained in an amount of 0.50% by mole relative to the total silanes. The molecular weight Mw of the obtained polymer was measured by GPC and found to be 2,400 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 2

4.95 g of phenyltrimethoxysilane, 72.25 g of tetraethoxysilane, 22.24 g of methyltriethoxysilane, 0.57 g of 2-(trimethoxysilylethyl)pyridine, and 150 g of acetone were charged into a 500 mL flask to be dissolved and the resultant mixed solution was warmed while stirring the mixed solution with a magnetic stirrer to reflux. Next, an aqueous solution in which 0.18 g of hydrochloric acid was dissolved in 33.20 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and hydrochloric acid were distilled off under reduced pressure to obtain a hydrolysis-condensation product. The polymer thus obtained corresponds to a polymer containing a group of silane structure units of Formula (VI-2):

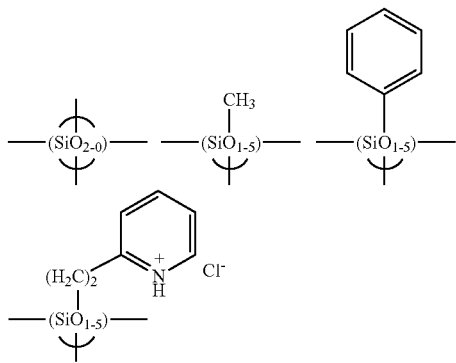

Formula (VI-2)

which is a polysiloxane in which a silane having a cyclic amino group is contained in an amount of 0.50% by mole relative to the total silanes. The molecular weight Mw of the obtained polymer was measured by GPC and found to be 1,400 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 3

4.95 g of phenyltrimethoxysilane, 72.25 g of tetraethoxysilane, 22.24 g of methyltriethoxysilane, 0.57 g of 2-(trimethoxysilylethyl)pyridine, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 33.20 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-3):

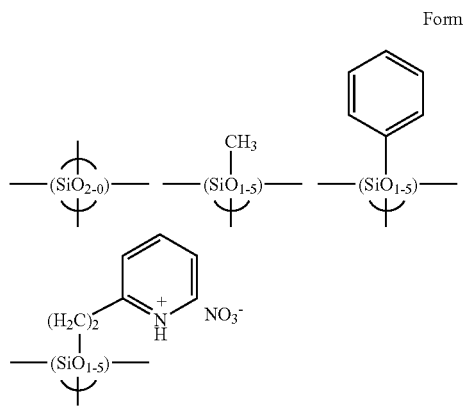

Formula (VI-3)

which is a polysiloxane in which a silane having a cyclic amino group is contained in an amount of 0.50% by mole relative to the total silanes. The molecular weight Mw of the obtained polymer was measured by GPC and found to be 1,300 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 4

4.95 g of phenyltrimethoxysilane, 72.25 g of tetraethoxysilane, 22.24 g of methyltriethoxysilane, 0.57 g of 2-(trimethoxysilylethyl)pyridine, and 150 g of acetone were charged into a 500 mL flask to be dissolved and the resultant mixed solution was warmed while stirring the mixed solution with a magnetic stirrer to reflux. Next, an aqueous solution in which 0.57 g of trifluoroacetic acid was dissolved in 33.20 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and trifluoroacetic acid were distilled off under reduced pressure to obtain a hydrolysis-condensation product. The polymer thus obtained corresponds to a polymer containing a group of silane structure units of Formula (VI-4):

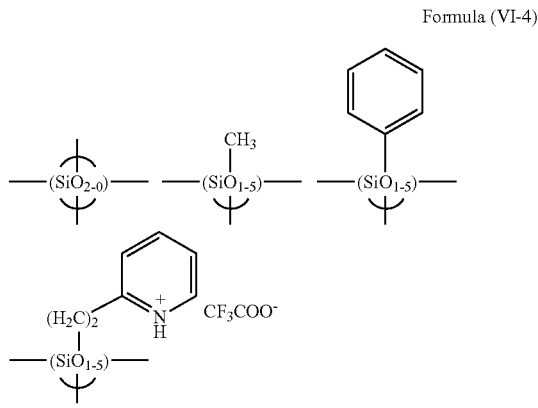

Formula (VI-4)

which is a polysiloxane in which a silane having a cyclic amino group is contained in an amount of 0.50% by mole relative to the total silanes. The molecular weight Mw of the obtained polymer was measured by GPC and found to be 3,400 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 5

4.95 g of phenyltrimethoxysilane, 72.25 g of tetraethoxysilane, 22.24 g of methyltriethoxysilane, 0.57 g of 2-(trimethoxysilylethyl)pyridine, and 150 g of acetone were charged into a 500 mL flask to be dissolved and the resultant mixed solution was warmed while stirring the mixed solution with a magnetic stirrer to reflux. Next, an aqueous solution in which 0.48 g of methanesulfonic acid was dissolved in 33.20 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and methanesulfonic acid were distilled off under reduced pressure to obtain a hydrolysis-condensation product. The polymer thus obtained corresponds to a polymer containing a group of silane structure units of Formula (VI-5):

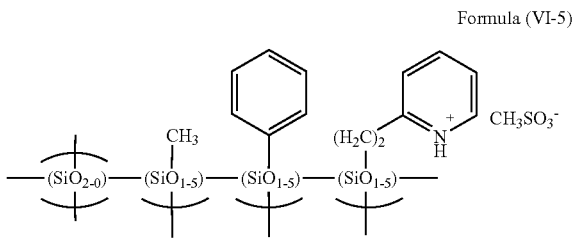

Formula (VI-5)

which is a polysiloxane in which a silane having a cyclic amino group is contained in an amount of 0.50% by mole relative to the total silanes. The molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 6

4.98 g of phenyltrimethoxysilane, 72.66 g of tetraethoxysilane, 22.37 g of methyltriethoxysilane, 0.69 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.58 g of maleic acid was dissolved in 33.39 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, and water were distilled off under reduced pressure to obtain a hydrolysis-condensation product. The polymer thus obtained corresponds to a polymer containing a group of silane structure units of Formula (VI-6):

Formula (VI-6)

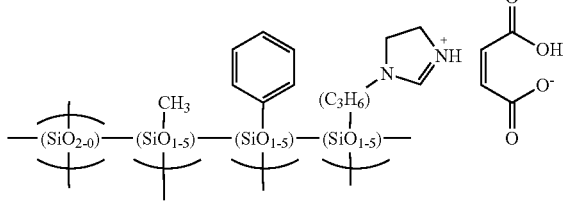

which is a polysiloxane in which a silane having a cyclic amino group is contained in an amount of 0.50% by mole relative to the total silanes. The molecular weight Mw of the obtained polymer was measured by GPC and found to be 2,400 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 7

4.98 g of phenyltrimethoxysilane, 72.66 g of tetraethoxysilane, 22.37 g of methyltriethoxysilane, 0.69 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.18 g of hydrochloric acid was dissolved in 33.39 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and hydrochloric acid were distilled off under reduced pressure to obtain a hydrolysis-condensation product. The polymer thus obtained corresponds to a polymer containing a group of silane structure units of Formula (VI-7):

Formula (VI-7)

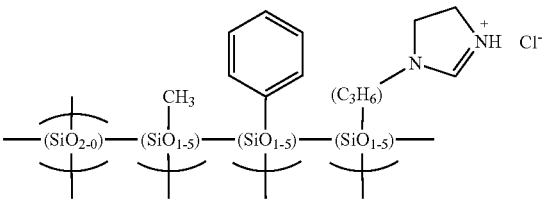

which is a polysiloxane in which a silane having a cyclic amino group is contained in an amount of 0.50% by mole relative to the total silanes. The molecular weight Mw of the obtained polymer was measured by GPC and found to be 1,500 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 8

4.98 g of phenyltrimethoxysilane, 72.66 g of tetraethoxysilane, 22.37 g of methyltriethoxysilane, 0.69 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.32 g of nitric acid was dissolved in 33.39 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-8):

Formula (VI-8)

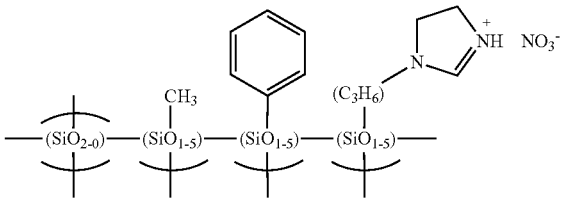

which is a polysiloxane in which a silane having a cyclic amino group is contained in an amount of 0.50% by mole relative to the total silanes. The molecular weight Mw of the obtained polymer was measured by GPC and found to be 1300 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 9

4.98 g of phenyltrimethoxysilane, 72.66 g of tetraethoxysilane, 22.37 g of methyltriethoxysilane, 0.69 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.48 g of trifluoroacetic acid was dissolved in 33.39 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and trifluoroacetic acid were distilled off under reduced pressure to obtain a hydrolysis-condensation product. The polymer thus obtained corresponds to a polymer containing a group of silane structure units of Formula (VI-9):

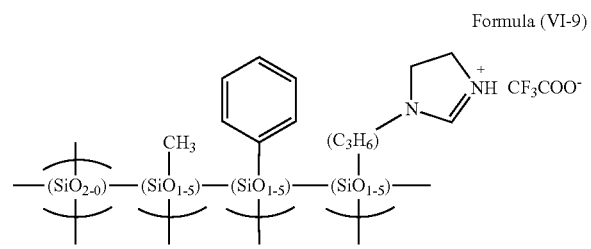

Formula (VI-9)

which is a polysiloxane in which a silane having a cyclic amino group is contained in an amount of 0.50% by mole relative to the total silanes. The molecular weight Mw of the obtained polymer was measured by GPC and found to be 3,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 10

4.98 g of phenyltrimethoxysilane, 72.66 g of tetraethoxysilane, 22.37 g of methyltriethoxysilane, 0.69 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.48 g of methanesulfonic acid was dissolved in 33.39 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and methanesulfonic acid were distilled off under reduced pressure to obtain a hydrolysis-condensation product. The polymer thus obtained corresponds to a polymer containing a group of silane structure units of Formula (VI-10):

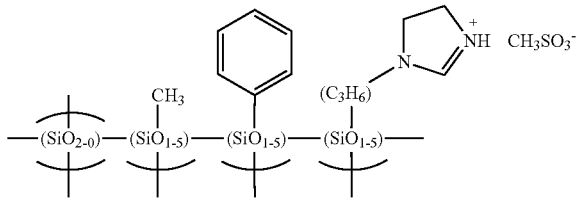

Formula (VI-10)

which is a polysiloxane in which a silane having a cyclic amino group is contained in an amount of 0.50% by mole relative to the total silanes. The molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 11

4.94 g of phenyltrimethoxysilane, 72.16 g of tetraethoxysilane, 22.21 g of methyltriethoxysilane, 0.69 g of trimethoxysilylpropylpyrrolidine, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 33.16 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-11):

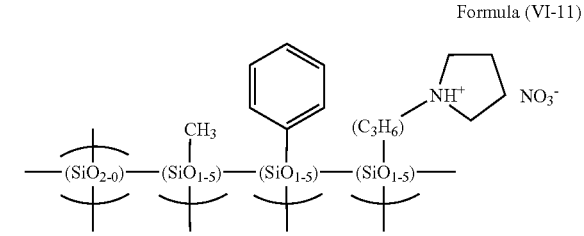

Formula (VI-11)

which is a polysiloxane in which a silane having a cyclic amino group is contained in an amount of 0.50% by mole relative to the total silanes. The molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 12

4.93 g of phenyltrimethoxysilane, 72.01 g of tetraethoxysilane, 22.17 g of methyltriethoxysilane, 0.89 g of (9-carbazole)ethyltriethoxysilane, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 33.10 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-12):

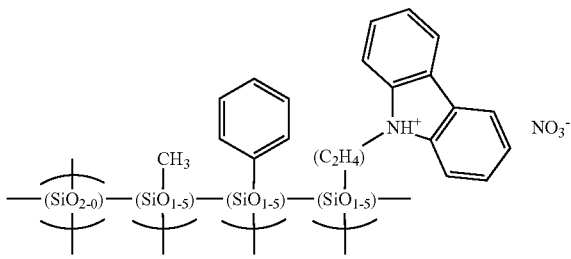

Formula (VI-12)

which is a polysiloxane in which a silane having a cyclic amino group is contained in an amount of 0.50% by mole relative to the total silanes. The molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 13

4.95 g of phenyltrimethoxysilane, 72.24 g of tetraethoxysilane, 22.24 g of methyltriethoxysilane, 0.57 g of N-(3-trimethoxysilylpropyl)imidazole, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 33.20 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-13):

Formula (VI-13)

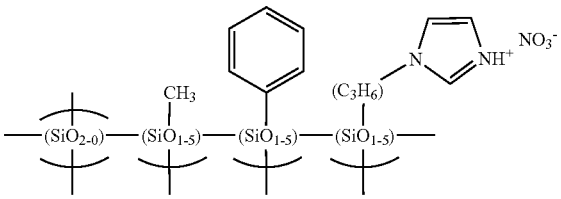

which is a polysiloxane in which a silane having a cyclic amino group is contained in an amount of 0.50% by mole relative to the total silanes. The molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 14

4.72 g of phenyltrimethoxysilane, 68.99 g of tetraethoxysilane, 12.74 g of methyltriethoxysilane, 0.65 g of triethoxysilylpropyl-4,5-dihydroimidazole, 12.89 g of bis(trimethoxysilyl)ethane, and 150 g of acetone were charged into a 500 mL flask to be dissolved and the resultant mixed solution was warmed while stirring the mixed solution with a magnetic stirrer to reflux. Next, an aqueous solution in which 0.30 g of nitric acid was dissolved in 34.28 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-14):

Formula (VI-14)

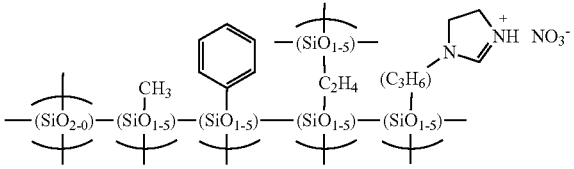

which is a polysiloxane in which a silane having a cyclic amino group is contained in an amount of 0.50% by mole relative to the total silanes. The molecular weight Mw of the obtained polymer was measured by GPC and found to be 1,300 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 15

4.94 g of phenyltrimethoxysilane, 71.58 g of tetraethoxysilane, 22.20 g of methyltriethoxysilane, 1.20 g of methoxybenzyltrimethoxysilane, 0.68 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 33.09 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-15):

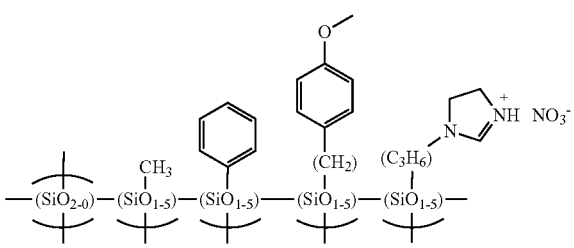

Formula (VI-15)

which is a polysiloxane in which a silane having a cyclic amino group is contained in an amount of 0.50% by mole relative to the total silanes. The molecular weight Mw of the obtained polymer was measured by GPC and found to be 2,200 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 16

4.94 g of phenyltrimethoxysilane, 72.42 g of tetraethoxysilane, 22.23 g of methyltriethoxysilane, 0.41 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.063 g of nitric acid was dissolved in 33.21 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-8) which is a polysiloxane in which a silane having a cyclic amino group is contained in an amount of 0.30% by mole relative to the total silanes. The molecular weight Mw of the obtained polymer was measured by GPC and found to be 1,500 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 17

4.95 g of phenyltrimethoxysilane, 72.67 g of tetraethoxysilane, 22.24 g of methyltriethoxysilane, 0.14 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.063 g of nitric acid was dissolved in 33.25 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-8) which is a polysiloxane in which a silane having a cyclic amino group is contained in an amount of 0.10% by mole relative to the total silanes. The molecular weight Mw of the obtained polymer was measured by GPC and found to be 1,500 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 18

4.95 g of phenyltrimethoxysilane, 72.73 g of tetraethoxysilane, 22.25 g of methyltriethoxysilane, 0.069 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.063 g of nitric acid was dissolved in 33.26 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-8) which is a polysiloxane in which a silane having a cyclic amino group is contained in an amount of 0.05% by mole relative to the total silanes. The molecular weight Mw of the obtained polymer was measured by GPC and found to be 1,500 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 19

4.95 g of phenyltrimethoxysilane, 71.80 g of tetraethoxysilane, 22.23 g of methyltriethoxysilane, 1.02 g of 2-(trimethoxysilylethyl)pyridine, and 150 g of acetone were charged into a 500 mL flask to be dissolved and the resultant mixed solution was warmed while stirring the mixed solution with a magnetic stirrer to reflux. Next, an aqueous solution in which 0.63 g of nitric acid was dissolved in 33.16 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer containing a group of silane structure units of Formula (VI-3) which is a polysiloxane in which a silane having a cyclic amino group is contained in an amount of 0.90% by mole relative to the total silanes. The molecular weight Mw of the obtained polymer was measured by GPC and found to be 1,900 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Synthesis Example 20

4.95 g of phenyltrimethoxysilane, 72.79 g of tetraethoxysilane, 22.25 g of methyltriethoxysilane, 0.014 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.063 g of nitric acid was dissolved in 33.26 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. As a result, a hydrolysis-condensation product was obtained. The polymer thus obtained corresponds to a polymer containing a group of silane structure units of Formula (VI-8) which is a polysiloxane in which a silane having a cyclic amino group is contained in an amount of 0.01% by mole relative to the total silanes. The molecular weight Mw of the obtained polymer was measured by GPC and found to be 1,500 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Comparative Synthesis Example 1

1.94 g of phenyltrimethoxysilane, 26.47 g of tetraethoxysilane, 10.46 g of methyltriethoxysilane, and 31.50 g of ethanol were charged into a 300 mL flask to be dissolved and the resultant mixed solution was warmed while stirring the mixed solution with a magnetic stirrer to reflux. Next, an aqueous solution in which 1.13 g of maleic acid was dissolved in 128.50 g of ion-exchanged water was added to the mixed solution. The mixed solution was subjected to the reaction for 120 minutes and the resultant reaction solution was cooled down to room temperature. Subsequently, 200 g of propylene glycol monopropyl ether was added to the reaction solution and ethanol as a reaction by-product and water were distilled off under reduced pressure to obtain a hydrolysis-condensation product. The polymer thus obtained corresponds to a polymer of Formula (VI-16):

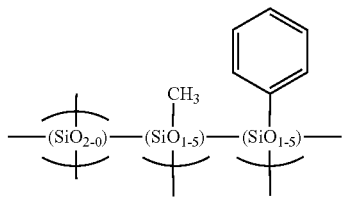

Formula (VI-16)

and the molecular weight thereof was measured by GPC and found to be 3,100 in terms of polystyrene. A component remaining after removal of the solvent from the obtained solution of the hydrolysis-condensation product at 140° C. was defined as the solid content and the solid content was adjusted with propylene glycol monoethyl ether to 10% by mass.

Comparative Synthesis Example 2

4.95 g of phenyltrimethoxysilane, 72.80 g of tetraethoxysilane, 22.25 g of methyltriethoxysilane, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 33.27 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. The polymer thus obtained corresponds to a polymer of Formula (VI-16) and the molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Comparative Synthesis Example 3

4.95 g of phenyltrimethoxysilane, 72.80 g of tetraethoxysilane, 22.25 g of methyltriethoxysilane, and 150 g of acetone were charged into a 500 mL flask to be dissolved and the resultant mixed solution was warmed while stirring the mixed solution with a magnetic stirrer to reflux. Next, an aqueous solution in which 0.58 g of maleic acid was dissolved in 33.27 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, and water were distilled off under reduced pressure to obtain a hydrolysis-condensation product. The polymer thus obtained corresponds to a polymer of Formula (VI-16) and the molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Comparative Synthesis Example 4

4.95 g of phenyltrimethoxysilane, 72.80 g of tetraethoxysilane, 22.25 g of methyltriethoxysilane, and 150 g of propylene glycol monoethyl ether were charged into a 500 mL flask to be dissolved and the resultant mixed solution was warmed while stirring the mixed solution with a magnetic stirrer to reflux. Next, an aqueous solution in which 0.58 g of maleic acid was dissolved in 33.27 g of ultrapure water was added to the mixed solution. The mixed solution was subjected to the reaction for 240 minutes and the resultant reaction solution was cooled down to room temperature. Thereafter, ethanol and methanol as reaction by-products were distilled off under reduced pressure to obtain a hydrolysis-condensation product. The polymer thus obtained corresponds to a polymer of Formula (VI-16). The molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Comparative Synthesis Example 5

1.93 g of phenyltrimethoxysilane, 25.18 g of tetraethoxysilane, 10.43 g of methyltriethoxysilane, 1.33 g of 2-(trimethoxysilylethyl)pyridine, and 32.90 g of ethanol were charged into a 300 mL flask to be dissolved and the resultant mixed solution was warmed while stirring the mixed solution with a magnetic stirrer to reflux. Next, an aqueous solution in which 1.13 g of maleic acid was dissolved in 127.09 g of ion-exchanged water was added to the mixed solution. The mixed solution was subjected to the reaction for 120 minutes and the resultant reaction solution was cooled down to room temperature. Subsequently, 200 g of propylene glycol monopropyl ether was added to the reaction solution and ethanol as a reaction by-product and water were distilled off under reduced pressure to obtain a hydrolysis-condensation product. The polymer thus obtained corresponds to a polymer containing a group of silane structure units of Formula (VI-1) which is a polysiloxane in which a silane having a cyclic amino group is contained in an amount of 3.00% by mole relative to the total silanes. The molecular weight Mw of the obtained polymer was measured by GPC and found to be 11,000 in terms of polystyrene.

Comparative Synthesis Example 6

1.92 g of phenyltrimethoxysilane, 25.01 g of tetraethoxysilane, 10.36 g of methyltriethoxysilane, 1.59 g of triethoxysilylpropyl-4,5-dihydroimidazole, and 33.77 g of ethanol were charged into a 300 mL flask to be dissolved and the resultant mixed solution was warmed while stirring the mixed solution with a magnetic stirrer to reflux. Next, an aqueous solution in which 1.12 g of maleic acid was dissolved in 126.22 g of ion-exchanged water was added to the mixed solution. The mixed solution was subjected to the reaction for 120 minutes and the resultant reaction solution was cooled down to room temperature. Subsequently, 200 g of propylene glycol monopropyl ether was added to the reaction solution and ethanol as a reaction by-product and water were distilled off under reduced pressure to obtain a hydrolysis-condensation product. The polymer thus obtained corresponds to a polymer containing a group of silane structure units of Formula (VI-6) which is a polysiloxane in which a silane having a cyclic amino group is contained in an amount of 3.00% by mole relative to the total silanes. The molecular weight Mw of the obtained polymer was measured by GPC and found to be 2,100 in terms of polystyrene.

Comparative Synthesis Example 7

4.93 g of phenyltrimethoxysilane, 71.52 g of tetraethoxysilane, 22.18 g of methyltriethoxysilane, 1.36 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.63 g of nitric acid was dissolved in 33.07 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. A hydrolysis-condensation product was obtained. The polymer thus obtained corresponds to a polymer containing a group of silane structure units of Formula (VI-8) which is a polysiloxane in which a silane having a cyclic amino group is contained in an amount of 1.0% by mole relative to the total silanes. The molecular weight Mw of the obtained polymer was measured by GPC and found to be 1,400 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Comparative Synthesis Example 8

4.95 g of phenyltrimethoxysilane, 72.79 g of tetraethoxysilane, 22.25 g of methyltriethoxysilane, 0.007 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.063 g of nitric acid was dissolved in 33.26 g of ultrapure water was added to the mixed solution. The mixed solution was subjected to the reaction for 240 minutes and the resultant reaction solution was cooled down to room temperature. Subsequently, 200 g of propylene glycol monoethyl ether was added to the reaction solution and ethanol and methanol as reaction by-products, acetone, water, and nitric acid were distilled off under reduced pressure to obtain a hydrolysis-condensation product. A hydrolysis-condensation product was obtained. The polymer thus obtained corresponds to a polymer containing a group of silane structure units of Formula (VI-8) which is a polysiloxane in which a silane having a cyclic amino group is contained in an amount of 0.005% by mole relative to the total silanes. The molecular weight Mw of the obtained polymer was measured by GPC and found to be 1,500 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Reference Synthesis Example 1

4.95 g of phenyltrimethoxysilane, 72.25 g of tetraethoxysilane, 22.24 g of methyltriethoxysilane, 0.57 g of 2-(trimethoxysilylethyl)pyridine, and 150 g of propylene glycol monoethyl ether were charged into a 500 mL flask to be dissolved and the resultant mixed solution was warmed while stirring the mixed solution with a magnetic stirrer to reflux. Next, an aqueous solution in which 0.58 g of maleic acid was dissolved in 33.27 g of ultrapure water was added to the mixed solution. The mixed solution was subjected to the reaction for 240 minutes and the resultant reaction solution was cooled down to room temperature. Thereafter, ethanol and methanol as reaction by-products were distilled off under reduced pressure to obtain a hydrolysis-condensation product. The polymer thus obtained corresponds to a polymer containing a group of silane structure units of Formula (VI-1) which is a polysiloxane in which a silane having a cyclic amino group is contained in an amount of 0.5% by mole relative to the total silanes. The molecular weight Mw of the obtained polymer was measured by GPC and found to be 1,700 in terms of polystyrene. A component remaining after removal of the solvent from the obtained solution of the hydrolysis-condensation product at 140° C. was defined as the solid content and the solid content was adjusted with propylene glycol monoethyl ether to 15% by mass.

Example 1

To 20 g of the solution (polymer concentration: 15% by mass) obtained in Synthesis Example 1, 10.44 g of ultrapure water and 56.10 g of propylene glycol monoethyl ether were added and the resultant mixture was filtered with a 0.1 μm filter to prepare a resist underlayer film material.

Example 2

To 20 g of the solution (polymer concentration: 15% by mass) obtained in Synthesis Example 2, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 3

To 20 g of the solution (polymer concentration: 15% by mass) obtained in Synthesis Example 3, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 4

To 20 g of the solution (polymer concentration: 15% by mass) obtained in Synthesis Example 4, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 5

To 10 g of the solution (polymer concentration: 15% by mass) obtained in Synthesis Example 5, 10 g of the solution (polymer concentration: 15% by mass) obtained in Synthesis Example 6, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 6

To 20 g of the solution (polymer concentration: 15% by mass) obtained in Synthesis Example 6, 10.44 g of ultrapure water and 56.10 g of propylene glycol monoethyl ether were added and the resultant mixture was filtered with a 0.1 μm filter to prepare a resist underlayer film material.

Example 7

To 20 g of the solution (polymer concentration: 15% by mass) obtained in Synthesis Example 7, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 8

To 20 g of the solution (polymer concentration: 15% by mass) obtained in Synthesis Example 8, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 9

To 20 g of the solution (polymer concentration: 15% by mass) obtained in Synthesis Example 9, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 10

To 10 g of the solution (polymer concentration: 15% by mass) obtained in Synthesis Example 10, 10 g of a solution (polymer concentration: 15% by mass) obtained in Synthesis Example 6, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 11

To 20 g of the solution (polymer concentration: 15% by mass) obtained in Synthesis Example 11, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 12

To 20 g of the solution (polymer concentration: 15% by mass) obtained in Synthesis Example 12, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 13

To 20 g of the solution (polymer concentration: 15% by mass) obtained in Synthesis Example 13, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 14

To 20 g of the solution (polymer concentration: 15% by mass) obtained in Synthesis Example 14, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 15

To 20 g of the solution (polymer concentration: 15% by mass) obtained in Synthesis Example 15, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 16

To 20 g of the solution (polymer concentration: 15% by mass) obtained in Synthesis Example 16, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 17

To 20 g of the solution (polymer concentration: 15% by mass) obtained in Synthesis Example 17, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 18

To 20 g of the solution (polymer concentration: 15% by mass) obtained in Synthesis Example 18, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 19

To 20 g of the solution (polymer concentration: 15%© by mass) obtained in Synthesis Example 19, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Example 20

To 20 g of the solution (polymer concentration: 15% by mass) obtained in Synthesis Example 20, 0.03 g of maleic acid, 10.44 g of ultrapure water, and 56.10 g of propylene glycol monoethyl ether were added and the resultant mixture was filtered with a 0.1 μm filter to prepare a resist underlayer film material.

Comparative Example 1

To 50 g of the solution (10% by mass) obtained in Comparative Synthesis Example 1, 6.84 g of ultrapure water, 57.63 g of propylene glycol monopropyl ether, and 27.38 g of propylene glycol monomethyl ether were added and the resultant mixture was filtered with a 0.1 μm filter to prepare a resist underlayer film material.

Comparative Example 2

To 50 g of the solution (10% by mass) obtained in Comparative Synthesis Example 1, 0.15 g of a low molecular salt benzyltriethylammonium chloride in an equimolar amount to an amount of a salt structure contained in Examples 1, 2, 7.05 g of ultrapure water, 60.69 g of propylene glycol monopropyl ether, and 28.19 g of propylene glycol monomethyl ether were added and the resultant mixture was filtered with a 0.1 μm filter to prepare a resist underlayer film material.

Comparative Example 3

Si Polymer (Nitric Acid Catalyst)+Maleic Acid (Added)

To 20 g of the solution (polymer concentration: 15% by mass) obtained in Comparative Synthesis Example 2, 0.03 g of maleic acid and 66.54 g of propylene glycol monoethyl ether were added and the resultant mixture was filtered with a 0.1 μm filter to prepare a resist underlayer film material.

Comparative Example 4

Si Polymer (Maleic Acid Catalyst)

To 20 g of the solution (polymer concentration: 15% by mass) obtained in Comparative Synthesis Example 3, 65.71 g of propylene glycol monoethyl ether was added and the resultant mixture was filtered with a 0.1 μm filter to prepare a resist underlayer film material.

Comparative Example 5

Si Polymer (Nitric Acid Catalyst)+Maleic Acid (Added)+Organic Salt (Added)

To 20 g of the solution (polymer concentration: 15% by mass) obtained in Comparative Synthesis Example 2, 0.03 g of maleic acid, 0.009 g of benzyltriethylammonium chloride, and 66.79 g of propylene glycol monoethyl ether were added and the resultant mixture was filtered with a 0.1 µM filter to prepare a resist underlayer film material.

Comparative Example 6

Si Polymer (Nitric Acid Catalyst)+Maleic Acid (Added)+Water (Added)

To 20 g of the solution (polymer concentration: 15% by mass) obtained in Comparative Synthesis Example 2, 0.03 g of maleic acid, 10.44 g of ultrapure water, and 56.10 g of propylene glycol monoethyl ether were added and the resultant mixture was filtered with a 0.1 µm filter to prepare a resist underlayer film material.

Comparative Example 7

Si Polymer (Maleic Acid Catalyst)+Water (Synthesized)+Organic Salt (Added)

To 20 g of the solution (polymer concentration: 15% by mass) obtained in Comparative Synthesis Example 4, 0.009 g of benzyltriethylammonium chloride, 10.37 g of ultrapure water, and 55.59 g of propylene glycol monoethyl ether were added and the resultant mixture was filtered with a 0.1 µm filter to prepare a resist underlayer film material.

Comparative Example 8

To 50 g of the solution (12% by mass) obtained in Comparative Synthesis Example 5, 6.51 g of ultrapure water, 52.51 g of propylene glycol monopropyl ether, and 26.07 g of propylene glycol monomethyl ether were added and the resultant mixture was filtered with a 0.1 µm filter to prepare a resist underlayer film material.

Comparative Example 9

To 50 g of the solution (8% by mass) obtained in Comparative Synthesis Example 6, 5.06 g of ultrapure water, 29.96 g of propylene glycol monopropyl ether, and 20.23 g of propylene glycol monomethyl ether were added and the resultant mixture was filtered with a 0.1 µm filter to prepare a resist underlayer film material.

Comparative Example 10

To 20 g of the solution (polymer concentration: 15% by mass) obtained in Comparative Synthesis Example 7, 0.03 g of maleic acid, 10.44 g of ultrapure water, and 56.10 g of propylene glycol monoethyl ether were added and the resultant mixture was filtered with a 0.1 µm filter to prepare a resist underlayer film material.

Comparative Example 11

To 20 g of the solution (polymer concentration: 15% by mass) obtained in Comparative Synthesis Example 8, 0.03 g of maleic acid, 10.44 g of ultrapure water, and 56.10 g of propylene glycol monoethyl ether were added and the resultant mixture was filtered with a 0.1 µm filter to prepare a resist underlayer film material.

Reference Example 1

To 20 g of the solution (polymer concentration: 15% by mass) obtained in Reference Synthesis Example 1, 10.34 g of ultrapure water and 55.38 g of propylene glycol monoethyl ether were added to prepare a resist underlayer film material.

(Solvent Resistance Evaluation)

The resist underlayer film material was applied on a silicon wafer by a spin coating method and was baked on a hot plate at 150° C. for 1 minute. Thereafter, the resist underlayer film was immersed in propylene glycol monomethyl ether acetate for 1 minute. When the change in the film thickness of the coating film between before and after the immersion was 2 nm or less, the evaluation was made as "advantageous (A)", and when the change was more than 2 nm, the evaluation was made as "disadvantageous (B)".

TABLE 1

| Solvent resistance test | |
|---|---|
| Example 1 | A |
| Example 2 | A |
| Example 3 | A |
| Example 4 | A |
| Example 5 | A |
| Example 6 | A |
| Example 7 | A |
| Example 8 | A |
| Example 9 | A |
| Example 10 | A |
| Example 11 | A |
| Example 12 | A |
| Example 13 | A |
| Example 14 | A |
| Example 15 | A |
| Example 16 | A |
| Example 17 | A |
| Example 18 | A |
| Example 19 | A |
| Example 20 | A |
| Comparative Example 1 | B |
| Comparative Example 2 | A |
| Comparative Example 3 | B |
| Comparative Example 4 | B |
| Comparative Example 5 | B |
| Comparative Example 6 | B |
| Comparative Example 7 | A |
| Comparative Example 8 | A |
| Comparative Example 9 | A |
| Comparative Example 10 | A |
| Comparative Example 11 | B |
| Reference Example 1 | A |

<Optical Constants>

The resist underlayer film solution was applied on a silicon wafer using a spinner. The composition was heated on a hot plate at 240° C. for 1 minute to form a resist underlayer film (film thickness: 0.09 µm). Then, the refractive index (n value) and the optical absorptivity (k value; also called as the attenuation coefficient) at a wavelength of 193 nm of the resist underlayer film were measured using a spectro-ellipsometer (VUV-VASE VU-302; manufactured by J.A. Woollam Corporation). The result of the measurement is shown in Table 2.

TABLE 2

| | Refractive index n and optical absorptivity k | |
|---|---|---|
| | Refractive index n (wavelength 193 nm) | Optical absorptivity k (wavelength 193 nm) |
| Example 1 | 1.62 | 0.13 |
| Example 2 | 1.61 | 0.12 |
| Example 3 | 1.61 | 0.12 |
| Example 4 | 1.61 | 0.12 |

TABLE 2-continued

Refractive index n and optical absorptivity k

| | Refractive index n (wavelength 193 nm) | Optical absorptivity k (wavelength 193 nm) |
|---|---|---|
| Example 5 | 1.62 | 0.13 |
| Example 6 | 1.63 | 0.14 |
| Example 7 | 1.63 | 0.13 |
| Example 8 | 1.63 | 0.13 |
| Example 9 | 1.63 | 0.13 |
| Example 10 | 1.63 | 0.14 |
| Example 11 | 1.63 | 0.13 |
| Example 12 | 1.63 | 0.13 |
| Example 13 | 1.63 | 1.63 |
| Example 14 | 1.63 | 1.63 |
| Example 15 | 1.63 | 0.15 |
| Example 16 | 1.61 | 0.12 |
| Example 17 | 1.61 | 0.12 |
| Example 18 | 1.61 | 0.12 |
| Example 19 | 1.62 | 0.12 |
| Example 20 | 1.61 | 0.12 |
| Comparative Example 1 | 1.59 | 0.11 |
| Comparative Example 2 | 1.63 | 0.13 |
| Comparative Example 3 | 1.60 | 0.11 |
| Comparative Example 4 | 1.60 | 0.12 |
| Comparative Example 5 | 1.61 | 0.11 |
| Comparative Example 6 | 1.60 | 0.11 |
| Comparative Example 7 | 1.60 | 0.11 |
| Comparative Example 8 | 1.59 | 0.11 |
| Comparative Example 9 | 1.63 | 0.13 |
| Comparative Example 10 | 1.61 | 0.12 |
| Comparative Example 11 | 1.61 | 0.11 |
| Reference Example 1 | 1.59 | 0.11 |

(Measurement of Dry Etching Rate)

Etchers and etching gases used in the measurement of dry etching rates are as follows.

ES401 (manufactured by Nippon Scientific Co., Ltd.): $CF_4$
RIE-10NR (manufactured by Samco, Inc.): $O_2$ Each of the solutions of resist underlayer film forming compositions prepared in Examples 1 to 20, Comparative Examples 1 to 11, and Reference Example 1 was applied on a silicon wafer using a spinner. The composition solution was heated on a hot plate at 240° C. for 1 minute to form a resist underlayer film (film thickness of 0.20 μm ($CF_4$ gas), film thickness of 0.08 μm ($O_2$ gas)). In the same manner, a photoresist solution (trade name: UV 113; manufactured by Shipley Company, L.L.C.) was applied on a silicon wafer using a spinner to form a coating film. Using $CF_4$ gas and $O_2$ gas as the etching gas, the dry etching rate was measured. Then, the dry etching rate of the resist film was compared with that of the resist underlayer film. The result is shown in Table 3. The rate ratio (1) is a dry etching rate ratio of (resist underlayer film)/(resist).

TABLE 3

Dry etching rate ratio

| | $CF_4$ gas | $O_2$ gas |
|---|---|---|
| Example 1 | 1.6 | 0.01 |
| Example 2 | 1.7 | 0.01 |
| Example 3 | 1.6 | 0.01 |
| Example 4 | 1.6 | 0.01 |
| Example 5 | 1.7 | 0.01 |
| Example 6 | 1.7 | 0.01 |
| Example 7 | 1.6 | 0.01 |
| Example 8 | 1.6 | 0.01 |
| Example 9 | 1.6 | 0.01 |
| Example 10 | 1.7 | 0.01 |
| Example 11 | 1.6 | 0.01 |
| Example 12 | 1.6 | 0.01 |
| Example 13 | 1.6 | 0.01 |
| Example 14 | 1.6 | 0.01 |
| Example 15 | 1.6 | 0.01 |
| Example 16 | 1.6 | 0.01 |
| Example 17 | 1.6 | 0.02 |
| Example 18 | 1.6 | 0.01 |
| Example 19 | 1.7 | 0.02 |
| Example 20 | 1.6 | 0.01 |
| Comparative Example 1 | 1.7 | 0.02 |
| Comparative Example 2 | 1.7 | 0.02 |
| Comparative Example 3 | 1.9 | 0.03 |
| Comparative Example 4 | 1.8 | 0.03 |
| Comparative Example 5 | 1.7 | 0.02 |
| Comparative Example 6 | 1.7 | 0.02 |
| Comparative Example 7 | 1.3 | 0.02 |
| Comparative Example 8 | 1.9 | 0.02 |
| Comparative Example 9 | 1.9 | 0.02 |
| Comparative Example 10 | 1.6 | 0.01 |
| Comparative Example 11 | 1.6 | 0.02 |
| Reference Example 1 | 1.3 | 0.02 |

<Preparation of Resist Organic Underlayer Film>

Into a 200 mL flask, 16.5 g of acenaphthylene, 1.5 g of 4-hydroxystyrene, and 60 g of 1,2-dichloroethane as a solvent were charged. Thereto, 1 g of trifluoro boron as a polymerization initiator was added and the resultant reaction mixture was heated to 60° C. and was subsequently subjected to the reaction for 24 hours. To this reaction solution, 1 L of methanol and 500 g of water were added and the resultant mixture was subjected to a re-precipitation purification, followed by filtering and drying the resultant white solid to obtain 11 g of a white polymer.

The obtained polymer of Formula (VI-17):

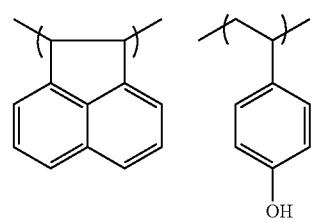

Formula (VI-17)

was measured by 13 C, 1H-NMR, and GPC and the constitution thereof was found to be acenaphthylene: 4-hydroxystyrene=86:14.

Mw: 6,000
Mw/Mn=1.5

To 10 g of the obtained polymer, 1.0 g of tetramethoxymethyl glycoluril (trade name: POWDER LINK 1174; manufactured by Mitsui Cytec Ltd.), 0.01 g of para-toluenesulfonic acid as a crosslinking catalyst, and 0.03 g of MEGAFAC R-30 (trade name; manufactured by Dainippon Ink and Chemicals, Inc.) as a surfactant were added and the resultant mixture was dissolved in 101.57 g of propylene glycol monomethyl ether acetate and 25.39 g of propylene glycol monomethyl ether. Thereafter, the resultant solution was filtered using a polyethylene microfilter having a pore diameter of 0.10 μm and was further filtered using a polyethylene microfilter having a pore diameter of 0.05 μm to prepare a solution of a resist underlayer film forming composition to be used for a lithography process by a multilayer film.

<Resist Patterning Evaluation 1>

An organic underlayer film (layer A) forming composition obtained based on the above Formula was applied on a silicon wafer and the composition was heated on a hot plate at 240° C. for 1 minute to obtain an organic underlayer film (layer A) having a film thickness of 250 nm. On the organic underlayer film (layer A), each of the resist underlayer film (layer B) compositions obtained in Examples 1 to 20, Comparative Examples 1 to 11, and Reference Example 1 was applied and the composition was heated on a hot plate at 240° C. for 1 minute to obtain a resist underlayer film (layer B) having a film thickness of 40 nm. On the resist underlayer film (layer B), a commercially available photoresist solution (trade name: PAR 855; manufactured by Sumitomo Chemical Co., Ltd.) was applied by a spinner and the solution was heated on a hot plate at 100° C. for 1 minute to form a photoresist film (layer C) having a film thickness of 150 nm. The patterning of the resist was performed using an immersion exposing machine (TWINSCAN XT: 1900Gi scanner; manufactured by ASML Holding N. V.; wavelength: 193 nm, NA, σ: 1.20, 0.94/0.74 (C-quad), immersion liquid: water). The target was a photoresist after the development having both a line width and a width between lines of 0.05 μm, which is a so-called line-and-space (dense line), and the exposure was performed through a mask set to form 15 lines. Thereafter, the resist pattern was baked on a hot plate at 105° C. for 60 seconds, was cooled down, and was developed with a 2.38% tetramethylammonium hydroxide developer.

With respect to the resist pattern skirt shape after the lithography was performed, a shape having a straight line was evaluated as "advantage" and a shape having an undercut (tapering of bottom portion), a footing (spreading of bottom portion), or a pattern collapse was evaluated as "disadvantage". Even in the case where a slight footing was partially observed, when there is practically no problem, such a shape was evaluated as "advantage (however, footing partially exists)". The length measurement of the resist size was performed using Hitachi High-Technologies S9380II (50,000 times). The resist shape was observed using NOVA NANOSEM 200 (manufactured by FEI Company; magnification: 500,000 times; tilt: 15 degrees).

TABLE 4

Resist shape evaluation

| | Resist skirt shape |
|---|---|
| Example 1 | Advantageous |
| Example 2 | Advantageous |
| Example 3 | Advantageous |
| Example 4 | Advantageous |
| Example 5 | Advantageous |
| Example 6 | Advantageous (however, footing partially exists) |
| Example 7 | Advantageous |
| Example 8 | Advantageous |
| Example 9 | Advantageous |
| Example 10 | Advantageous |
| Example 11 | Advantageous |
| Example 12 | Advantageous |
| Example 13 | Advantageous |
| Example 14 | Advantageous |
| Example 15 | Advantageous |
| Example 16 | Advantageous |
| Example 17 | Advantageous |
| Example 18 | Advantageous |
| Example 19 | Advantageous |
| Example 20 | Advantageous |
| Comparative Example 1 | Pattern collapse |
| Comparative Example 2 | Footing |
| Comparative Example 3 | Pattern collapse |
| Comparative Example 4 | Pattern collapse |
| Comparative Example 5 | Advantageous |
| Comparative Example 6 | Undercut |
| Comparative Example 7 | Advantageous |
| Comparative Example 8 | Footing |
| Comparative Example 9 | Footing |
| Comparative Example 10 | Footing |
| Comparative Example 11 | Pattern collapse |
| Reference Example 1 | Advantageous |

<Resist Patterning Evaluation 2: after Preservation of Pattern at 35° C. for 1 Month>

An organic underlayer film (layer A) forming composition obtained based on the above Formula was applied on a silicon wafer and the composition was heated on a hot plate at 240° C. for 1 minute to obtain an organic underlayer film (layer A) having a film thickness of 250 nm. On the organic underlayer film (layer A), each of the resist underlayer film (layer B) compositions obtained in Examples 1 to 20, Comparative Examples 1 to 11, and Reference Example 1 was applied and the composition was heated on a hot plate at 240° C. for 1 minute to obtain a resist underlayer film (layer B) having a film thickness of 40 nm. On the resist underlayer film (layer B), a commercially available photoresist solution (trade name: PAR 855; manufactured by Sumitomo Chemical Co., Ltd.) was applied by a spinner and the solution was heated on a hot plate at 100° C. for 1 minute to form a photoresist film (layer C) having a film thickness of 150 nm. The patterning of the resist was performed using an immersion exposing machine (TWINSCAN XT: 1900Gi scanner; manufactured by ASML Holding N. V.; wavelength: 193 nm, NA, σ: 1.20, 0.94/0.74 (C-quad), immersion liquid: water). The target was a photoresist after the development having both a line width and a width between lines of 0.05 μm, which is a so-called line-and-space (dense line), and the exposure was performed through a mask set to form 15 lines. Thereafter, the resist pattern was baked on a hot plate at 105° C. for 60 seconds, was cooled down, and was developed with a 2.38% tetramethylammonium hydroxide developer.

With respect to the resist pattern skirt shape after the lithography was performed, a shape having a straight line was evaluated as "advantage" and a shape having an undercut (tapering of bottom portion), a footing (spreading of bottom portion), or a pattern collapse was evaluated as "disadvantage". Even in the case where a slight footing was partially observed, when there is practically no problem, such a shape was evaluated as "advantage (however, footing partially exists)". The length measurement of the resist size was performed using Hitachi High-Technologies S9380II (50,000 times). The resist shape was observed using NOVA NANOSEM 200 (manufactured by FEI Company; magnification: 500,000 times; tilt: 15 degrees).

TABLE 5

Resist shape evaluation

| | Resist skirt shape |
|---|---|
| Example 1 | Advantageous |
| Example 2 | Advantageous |

TABLE 5-continued

Resist shape evaluation

| | Resist skirt shape |
|---|---|
| Example 3 | Advantageous |
| Example 4 | Advantageous |
| Example 5 | Advantageous |
| Example 6 | Advantageous (however, footing partially exists) |
| Example 7 | Advantageous |
| Example 8 | Advantageous |
| Example 9 | Advantageous |
| Example 10 | Advantageous |
| Example 11 | Advantageous |
| Example 12 | Advantageous |
| Example 13 | Advantageous |
| Example 14 | Advantageous |
| Example 15 | Advantageous |
| Example 16 | Advantageous |
| Example 17 | Advantageous |
| Example 18 | Advantageous |
| Example 19 | Advantageous |
| Example 20 | Advantageous |
| Comparative Example 1 | Pattern collapse |
| Comparative Example 2 | Undercut |
| Comparative Example 3 | Pattern collapse |
| Comparative Example 4 | Pattern collapse |
| Comparative Example 5 | Undercut |
| Comparative Example 6 | Undercut |
| Comparative Example 7 | Undercut |
| Comparative Example 8 | Undercut |
| Comparative Example 9 | Undercut |
| Comparative Example 10 | Footing |
| Comparative Example 11 | Pattern collapse |
| Reference Example 1 | Undercut |

<Resist Patterning Evaluation 3: Dependency on Film Thickness>

An organic underlayer film (layer A) forming composition obtained based on the above Formula was applied on a silicon wafer and the composition was heated on a hot plate at 240° C. for 1 minute to obtain an organic underlayer film (layer A) having a film thickness of 250 nm. On the organic underlayer film (layer A), each of the resist underlayer film (layer B) compositions obtained in Examples 14 to 15 was applied and the composition was heated on a hot plate at 240° C. for 1 minute to obtain a resist underlayer film (layer B). On the resist underlayer film (layer B), a commercially available photoresist solution (trade name: PAR 855; manufactured by Sumitomo Chemical Co., Ltd.) was applied by a spinner and the solution was heated on a hot plate at 100° C. for 1 minute to form a photoresist film (layer C) having a film thickness of 150 nm. The patterning of the resist was performed using an exposing machine (S307E scanner; manufactured by NiKON Corporation; wavelength: 193 nm, NA, σ: 0.85, 0.93/0.85 (Dipole)). The target was a photoresist after the development having both a line width and a width between lines of 0.065 μm, which is a so-called line-and-space (dense line), and the exposure was performed through a mask set to form nine lines. Thereafter, the resist pattern was baked on a hot plate at 105° C. for 60 seconds, was cooled down, and was developed with a 2.38% tetramethylammonium hydroxide developer.

With respect to the resist pattern skirt shape after the lithography was performed, a shape having a straight line was evaluated as "advantage" and a shape having an undercut (tapering of bottom portion), a footing (spreading of bottom portion), or a pattern collapse was evaluated as "disadvantage". Even in the case where a slight footing was partially observed, when there is practically no problem, such a shape was evaluated as "advantage (however, footing partially exists)".

TABLE 6

Resist shape evaluation

| | (Film thickness) | Resist skirt shape |
|---|---|---|
| Example 14 | (40 nm) | Advantageous |
| Example 14 | (80 nm) | Advantageous |
| Example 14 | (160 nm) | Advantageous |
| Example 15 | (40 nm) | Advantageous |
| Example 15 | (80 nm) | Advantageous |
| Example 15 | (160 nm) | Advantageous |

By blending a low molecule salt in the composition, the condensation of a silanol is highly accelerated and a film having high curability is provided. However, due to the low molecule component, the low molecule salt is transferred into the resist or has a high Si-ARC surface segregation degree, and therefore, it may impair the resist shape. On the contrary, almost all hydrolyzable silane compounds having a cyclic amino group do not exhibit strong basicity, so that these silane compounds are subjected to a neutralization reaction with an arbitrary acid during a sol-gel polymerization to form a siloxane polymer having a salt structure. The siloxane polymer having a salt structure can improve the transition into the resist or the surface uneven distribution of the low molecule salt, so that the siloxane polymer becomes a Si-containing bottom anti-reflective coating providing advantageous patterning performance for various film thicknesses.

In Examples 1 to 20, the resist pattern had a resist shape in substantially perpendicular shape. Particularly, for obtaining a finer pattern, as shown in Examples 1 to 20 and Comparative Examples 10 and 11, it can be mentioned to be preferred that the polysiloxane is a polysiloxane in which a silane having a cyclic amino group is contained in an amount of less than 1% by mole, preferably 0.01 to 0.95% by mole, more preferably 0.01 to 0.50% by mole relative to the total silanes. Particularly, by using an acid exhibiting a moderately strong acidity such as nitric acid, hydrochloric acid, and trifluoroacetic acid, an advantageous resist shape can be obtained. By using a blend of polysiloxanes, between which acid species and cyclic amine species are respectively different, as in Example 5, or by using a blend of polysiloxanes, between which only acid species are different, as in Example 10, an advantageous resist shape can be obtained. Particularly, by using a bis-silane having many reaction points, the density of the resist underlayer film is enhanced, so that an advantageous resist shape can be obtained. For controlling the resist shape, by incorporating a silane having phenol or an alkoxyphenyl group in the composition, a resist shape having a more advantageous skirt shape can be obtained. Thus, the use of a combination of a bis-silane or a phenolic silane capable of improving the resist shape with a siloxane polymer having an organic salt structure is an extremely useful method.

On the contrary, in Comparative Examples 1, 3, 4, and 6 containing no organic salt structure, a silanol remains in a large amount, so that the resist shape is impaired. As in Comparative Examples 1, 2, 4, and 7 and Reference Example 1, a sol-gel reaction using maleic acid as a catalyst does not satisfactorily progress the hydrolysis, so that the increase of the film thickness and a pattern collapse are caused after the preservation at 35° C. for one month. Therefore, a method including: performing the hydrolysis with a strong acid such as hydrochloric acid, nitric acid, a fluorine-containing carboxylic acid, and sulfonic acid; removing the strong acid out of the reaction mixture; and adding water and maleic acid to the reaction mixture, is extremely effective in terms of resist patterning property and preservation stability.

A Si-containing bottom anti-reflective coating containing an organic salt structure has not only advantageous lithography property, but also advantageous etching property, optical properties, and high preservation stability. Thus, as described above, a siloxane polymer produced by hydrolysis and polycondensation using a cyclic amine functions as an advantageous Si-containing bottom anti-reflective coating for a resist underlayer film.

INDUSTRIAL APPLICABILITY

The present invention can provide a resist underlayer film forming composition for lithography capable of being applied to the production of semiconductor devices. Particularly, the present invention can provide a resist underlayer film forming composition for lithography for forming a resist underlayer film capable of being used as a hardmask.

BRIEF DESCRIPTION OF THE DRAWINGS

FIG. 1 is a cross section SEM (scanning electron microscope photograph, magnification: 500,000 times) photograph of a pattern shape obtained in Example 15.

FIG. 2 is a cross section SEM (scanning electron microscope photograph, magnification: 500,000 times) photograph of a pattern shape obtained in Example 18.

FIG. 3 is a cross section SEM (scanning electron microscope photograph, magnification: 500,000 times) photograph of a pattern shape obtained in Example 19.

FIG. 4 is a cross section SEM (scanning electron microscope photograph, magnification: 500,000 times) photograph of a pattern shape obtained in Example 20.

FIG. 5 is a cross section SEM (scanning electron microscope photograph, magnification: 500,000 times) photograph of a pattern shape obtained in Comparative Example 10.

FIG. 6 is an SEM (scanning electron microscope photograph, magnification: 50,000 times) photograph, in which a pattern shape obtained in Comparative Example 11 is observed from above.

The invention claimed is:

1. A resist underlayer film produced by applying a resist underlayer film forming composition on a semiconductor substrate and baking the composition, the resist underlayer film having a thickness of 10 to 1,000 nm, and the resist underlayer film including thereon a resist film,
wherein the resist underlayer film forming composition comprises a silane, the silane comprising a combination of:
(i) a compound of Formula (1):

where:
R$^1$ is an ammonium salt of a cyclic amino group or an organic group containing an ammonium salt of a cyclic amino group, with a N atom or a C atom at a terminal of the group being bonded to a Si atom to form a Si—N bond or a Si—C bond,
R$^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, with a C atom at a terminal of the group being bonded to a Si atom to form a Si—C bond,
R$^3$ is an alkoxy group, an acyloxy group, or a halogen atom,
a is an integer of 1 or 2,
b is an integer of 0 or 1, and
a+b is an integer of 1 or 2,
and (ii) at least one type of organic silicon compound selected from the group consisting of
(a) an organic silicon compound of Formula (4):

where:
R$^6$ is an alkyl group, an aryl group, a halogenated alkyl group, a halogenated aryl group, an alkenyl group, or an organic group having an epoxy group, an acryloyl group, a methacryloyl group, a mercapto group, or a cyano group, with a C atom at a terminal of the group being bonded to a Si atom to form a Si—C bond,
R$^7$ is an alkoxy group, an acyloxy group, or a halogen atom, and
a is an integer of 0 to 3, and
(b) an organic silicon compound of Formula (5):

where:
R$^8$ is an alkyl group,
R$^9$ is an alkoxy group, an acyloxy group, or a halogen atom,
Y is an alkylene group or an arylene group,
b is an integer of 0 or 1, and
c is an integer of 0 or 1,
wherein the silane has the ammonium salt of a cyclic amino group contained in an amount of 0.01 to 0.95% by mole relative to the total silanes in the composition, and
wherein the silane is a hydrolyzable organosilane, a hydrolysis product thereof, or a hydrolysis-condensation product thereof.

2. The resist underlayer film according to claim 1, wherein the cyclic amino group is a secondary amino group or a tertiary amino group.

3. The resist underlayer film according to claim 1, wherein the cyclic amino group is an aromatic heterocyclic amino group of Formula (2):

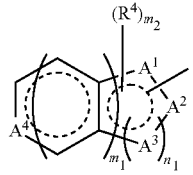

where:
A$^1$, A$^2$, A$^3$, and A$^4$ are independently a carbon atom or a nitrogen atom, at least one of A$^1$ to A$^4$ being a nitrogen atom,
substituents R$^4$s are independently an alkyl group, an aryl group, an aralkyl group, an alkenyl group, a hydroxy group, or a combination thereof, R$^4$s together optionally forming a ring, $n_1$ is an integer of 1 to 8,
$m_1$ is an integer of 0 or 1, and
$m_2$ is 0 or an integer ranging from 1 to a maximum number that can be substituted on a monocycle or a polycycle; or
an aliphatic heterocyclic amino group of Formula (3):

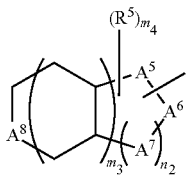

Formula (3)

where:
A$^5$, A$^6$, A$^7$, and A$^8$ are independently a carbon atom or a nitrogen atom, at least one of A$^5$ to A$^8$ being a nitrogen atom,
substituents R$^5$s are independently an alkyl group, an aryl group, an aralkyl group, an alkenyl group, a hydroxy group, or a combination thereof, R$^5$s together optionally forming a ring,
$n_2$ is an integer of 1 to 8,
$m_3$ is an integer of 0 or 1, and
$m_4$ is 0 or an integer ranging from 1 to a maximum number that can be substituted on a monocycle or a polycycle.

4. The resist underlayer film according to claim 1, wherein the resist underlayer film forming composition further comprises an acid as a hydrolysis catalyst.

5. The resist underlayer film according to claim 1, wherein the resist underlayer film forming composition further comprises water.

6. The resist underlayer film according to claim 1, wherein the silane having the ammonium salt of a cyclic amino group is contained in an amount of 0.05 to 0.5% by mole relative to the total silanes.

7. The resist underlayer film according to claim 1, wherein the resist underlayer film forming composition further comprises an organic acid and water.

8. The resist underlayer film according to claim 1, wherein the resist underlayer film has a thickness of 20 to 500 nm.

9. The resist underlayer film according to claim 1, wherein the resist film includes a photoacid generator.

10. A production method of a semiconductor device, the production method comprising:
applying a resist underlayer film forming composition on a semiconductor substrate and baking the composition to form a resist underlayer film having a thickness of 10 to 1,000 nm,
wherein the resist underlayer film forming composition comprises a silane, the silane comprising a combination of:
(i) a compound of Formula (1):

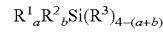

Formula (1)

where:
R$^1$ is an ammonium salt of a cyclic amino group or an organic group containing an ammonium salt of a cyclic amino group, with a N atom or a C atom at a terminal of the group being bonded to a Si atom to form a Si—N bond or a Si—C bond,
R$^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, with a C atom at a terminal of the group being bonded to a Si atom to form a Si—C bond,
R$^3$ is an alkoxy group, an acyloxy group, or a halogen atom,
a is an integer of 1 or 2,
b is an integer of 0 or 1, and
a+b is an integer of 1 or 2,
and (ii) at least one type of organic silicon compound selected from the group consisting of
(a) an organic silicon compound of Formula (4):

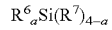 Formula (4)

where:
R$^6$ is an alkyl group, an aryl group, a halogenated alkyl group, a halogenated aryl group, an alkenyl group, or an organic group having an epoxy group, an acryloyl group, a methacryloyl group, a mercapto group, or a cyano group, with a C atom at a terminal of the group being bonded to a Si atom to form a Si—C bond,
R$^7$ is an alkoxy group, an acyloxy group, or a halogen atom, and
a is an integer of 0 to 3, and
(b) an organic silicon compound of Formula (5):

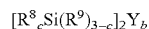 Formula (5)

where:
R$^8$ is an alkyl group,
R$^9$ is an alkoxy group, an acyloxy group, or a halogen atom,
Y is an alkylene group or an arylene group,
b is an integer of 0 or 1, and
c is an integer of 0 or 1,
wherein the silane has the ammonium salt of a cyclic amino group contained in an amount of 0.01 to 0.95% by mole relative to the total silanes in the composition, and
wherein the silane is a hydrolyzable organosilane, a hydrolysis product thereof, or a hydrolysis-condensation product thereof;
applying a composition for a resist on the resist underlayer film to form a resist film;
exposing the resist film to light into a predetermined pattern mode;
developing the resist after exposure to obtain a resist pattern;
etching the resist underlayer film according to the resist pattern; and
processing the semiconductor substrate according to the pattern of the patterned resist and of the patterned resist underlayer film.

11. The production method according to claim 10, wherein the resist underlayer film has a thickness of 20 to 500 nm.

12. The production method according to claim 10, wherein the resist film includes a photoacid generator.

13. A production method of a semiconductor device, the production method comprising:
forming an organic underlayer film on a semiconductor substrate;
applying a resist underlayer film forming composition on the organic underlayer film and baking the composition to form a resist underlayer film having a thickness of 10 to 1,000 nm, wherein the resist underlayer film forming composition comprises a silane, the silane comprising a combination of:

(i) a compound of Formula (1):

$$R^1_a R^2_b Si(R^3)_{4-(a+b)} \quad \text{Formula (1)}$$

where:
- $R^1$ is an ammonium salt of a cyclic amino group or an organic group containing an ammonium salt of a cyclic amino group, with a N atom or a C atom at a terminal of the group being bonded to a Si atom to form a Si—N bond or a Si—C bond,
- $R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, with a C atom at a terminal of the group being bonded to a Si atom to form a Si—C bond,
- $R^3$ is an alkoxy group, an acyloxy group, or a halogen atom,
- a is an integer of 1 or 2,
- b is an integer of 0 or 1, and
- a+b is an integer of 1 or 2, and (ii) at least one type of organic silicon compound selected from the group consisting of (a) an organic silicon compound of Formula (4):

$$R^6_a Si(R^7)_{4-a} \quad \text{Formula (4)}$$

where:
- $R^6$ is an alkyl group, an aryl group, a halogenated alkyl group, a halogenated aryl group, an alkenyl group, or an organic group having an epoxy group, an acryloyl group, a methacryloyl group, a mercapto group, or a cyano group, with a C atom at a terminal of the group being bonded to a Si atom to form a Si—C bond,
- $R^7$ is an alkoxy group, an acyloxy group, or a halogen atom, and
- a is an integer of 0 to 3, and (b) an organic silicon compound of Formula (5):

$$[R^8_c Si(R^9)_{3-c}]_2 Y_b \quad \text{Formula (5)}$$

where:
- $R^8$ is an alkyl group,
- $R^9$ is an alkoxy group, an acyloxy group, or a halogen atom,
- Y is an alkylene group or an arylene group,
- b is an integer of 0 or 1, and
- c is an integer of 0 or 1, wherein the silane has the ammonium salt of a cyclic amino group contained in an amount of 0.01 to 0.95% by mole relative to the total silanes in the composition, and wherein the silane is a hydrolyzable organosilane, a hydrolysis product thereof, or a hydrolysis-condensation product thereof;

applying a composition for a resist on the resist underlayer film to form a resist film;

exposing the resist film to light into a predetermined pattern mode;

developing the resist after exposure to obtain a resist pattern;

etching the resist underlayer film according to the resist pattern;

etching the organic underlayer film according to the pattern of the patterned resist underlayer film; and processing the semiconductor substrate according to the pattern of the patterned organic underlayer film.

14. The production method according to claim 13, wherein the resist underlayer film has a thickness of 20 to 500 nm.

15. The production method according to claim 13, wherein the resist film includes a photoacid generator.

* * * * *